(12) United States Patent
Lee

(10) Patent No.: US 11,424,304 B2
(45) Date of Patent: Aug. 23, 2022

(54) DISPLAY PANEL HAVING EDGE AREA WITH MARGIN AREAS AND CONTACT AREAS

(71) Applicant: Samsung Display Co., Ltd., Yongin-si (KR)

(72) Inventor: Gyeong-im Lee, Daegu (KR)

(73) Assignee: Samsung Display Co., Ltd., Yongin-si (KR)

( * ) Notice: Subject to any disclaimer, the term of this patent is extended or adjusted under 35 U.S.C. 154(b) by 159 days.

(21) Appl. No.: 16/134,001

(22) Filed: Sep. 18, 2018

(65) Prior Publication Data
US 2019/0157363 A1    May 23, 2019

(30) Foreign Application Priority Data
Nov. 21, 2017   (KR) .......................... 10-2017-0155935

(51) Int. Cl.
*H01L 27/32*        (2006.01)
*H01L 27/12*        (2006.01)
(Continued)

(52) U.S. Cl.
CPC ....... *H01L 27/3246* (2013.01); *G09G 3/3208* (2013.01); *H01L 27/124* (2013.01);
(Continued)

(58) Field of Classification Search
CPC ............. H01L 27/3202; H01L 27/3204; H01L 27/3244–3279; H01L 27/326–3265; H01L 27/3276–3279; H01L 27/3297; H01L 27/124; H01L 51/5012; H01L 51/5221; H01L 51/5206;
(Continued)

(56) References Cited

U.S. PATENT DOCUMENTS 8,968,477 B2    3/2015 Kang et al.
9,305,981 B2 *  4/2016 Furuie ................. H01L 27/3223
(Continued)

FOREIGN PATENT DOCUMENTS

JP    2010-027504 A    2/2010
KR   10-2005-0090586 A   9/2005
(Continued)

*Primary Examiner* — David Chen
(74) *Attorney, Agent, or Firm* — Lewis Roca Rothgerber Christie LLP

(57) ABSTRACT

A display panel including an active area including organic light emitting elements therein; and an edge area adjacent to the active area and including a power line and auxiliary electrode therein, the auxiliary electrode being connected to the power line, and the edge area including margin and contact areas, wherein the organic light emitting elements include a first electrode; a second electrode on; and organic layers between the first electrode and the second electrode, wherein the auxiliary electrode and the second electrode are spaced apart from each other in the margin areas and are connected to each other in the contact areas, and wherein the contact areas and the margin areas face, and are spaced apart in a first direction from, the first electrodes that are adjacent to the edge area, and wherein the contact and margin areas are alternately arranged in a second direction that intersects the first direction.

17 Claims, 17 Drawing Sheets

(51) Int. Cl.
  *H01L 51/50*   (2006.01)
  *H01L 51/52*   (2006.01)
  *G09G 3/3208*  (2016.01)

(52) U.S. Cl.
  CPC ...... *H01L 27/3279* (2013.01); *H01L 51/5012* (2013.01); *H01L 51/5206* (2013.01); *H01L 51/5221* (2013.01); *G09G 2300/0426* (2013.01); *G09G 2310/08* (2013.01)

(58) Field of Classification Search
  CPC ......... G09G 3/3233–3258; G09G 2300/0408; G09G 3/3266–3291; G09G 2300/0426
  USPC ......................................................... 257/40
  See application file for complete search history.

(56) References Cited

U.S. PATENT DOCUMENTS

| | | |
|---|---|---|
| 9,735,388 B2 | 8/2017 | Kim et al. |
| 9,893,128 B2 | 2/2018 | Choi et al. |
| 9,934,727 B2 | 4/2018 | Pyon |
| 2005/0200270 A1* | 9/2005 | Kwak ............... H01L 27/3276 313/502 |
| 2006/0255726 A1* | 11/2006 | Kim ................... H01L 27/3279 313/506 |
| 2009/0015145 A1 | 1/2009 | Park et al. |
| 2009/0309489 A1* | 12/2009 | Takata ............... H01L 27/3276 313/504 |
| 2013/0049003 A1* | 2/2013 | Choi ................... H01L 51/5246 257/72 |
| 2014/0332769 A1* | 11/2014 | Lee .................... H01L 27/3272 257/40 |
| 2014/0361273 A1* | 12/2014 | Nozawa ............. H01L 27/3276 257/40 |
| 2015/0001500 A1* | 1/2015 | Sung .................. H01L 27/3244 257/40 |
| 2015/0179099 A1* | 6/2015 | Go .......................... H01L 51/56 345/206 |
| 2016/0190521 A1* | 6/2016 | Lee .................... H01L 27/3209 257/40 |
| 2017/0287994 A1* | 10/2017 | Senda ................ H01L 51/5218 |
| 2017/0288167 A1* | 10/2017 | Hanari ............... H01L 51/5246 |

FOREIGN PATENT DOCUMENTS

| | | |
|---|---|---|
| KR | 10-2009-0005541 A | 1/2009 |
| KR | 10-2015-0049640 A | 5/2015 |
| KR | 10-2016-0058360 A | 5/2016 |
| KR | 10-2017-0113780 A | 10/2017 |
| KR | 10-2017-0116556 A | 10/2017 |

* cited by examiner

DISPLAY PANEL HAVING EDGE AREA WITH MARGIN AREAS AND CONTACT AREAS

CROSS-REFERENCE TO RELATED APPLICATION

Korean Patent Application No. 10-2017-0155935, filed on Nov. 21, 2017, in the Korean Intellectual Property Office, and entitled: "Display Panel," is incorporated by reference herein in its entirety.

BACKGROUND

1. Field

Embodiments relate to a display panel.

2. Description of the Related Art

Display panels may include various display elements. Organic light emitting display panels including an organic light emitting element have been developed. An organic light emitting display panel may include an organic light emitting layer, a first electrode under the organic light emitting layer, and a second electrode on the organic light emitting layer. The organic light emitting display panel may display an image using light generated from the organic light emitting layer by forming a potential difference between the first electrode and the second electrode.

The organic light emitting display panels may be classified into a front surface light emitting type and a rear surface light emitting type. In the front surface light emitting type, light generated from the organic light emitting layer may pass through the second electrode and then may be outputted to the outside. In the rear surface light emitting type, light generated from the organic light emitting layer may be reflected by the second electrode and then may be outputted to the outside.

SUMMARY

The embodiments may be realized by providing a display panel including an active area including a plurality of organic light emitting elements therein; and an edge area adjacent to the active area and including a power line and an auxiliary electrode therein, the auxiliary electrode being connected to the power line, and the edge area including a plurality of margin areas and a plurality of contact areas, wherein each of the organic light emitting elements includes a first electrode; a second electrode on the first electrode; and a plurality of organic layers between the first electrode and the second electrode, wherein the auxiliary electrode and the second electrode are spaced apart from each other in the margin areas and are connected to each other in the contact areas, wherein the contact areas and the margin areas face, and are spaced apart in a first direction from, the first electrodes that are adjacent to the edge area, and wherein the contact areas and the margin areas are alternately arranged in a second direction that intersects the first direction.

The organic layers may include an emitting pattern including a light emitting material; a first charge control layer between the emitting pattern and the first electrode; and a second charge control layer between the emitting pattern and the second electrode, and the first charge control layer and the second charge control layer may extend into the edge area and between the auxiliary electrode and the second electrode.

The second electrode may be in direct contact with the auxiliary electrode in each of the contact areas.

The display panel may further include a pixel defining layer between the second electrode and the first electrodes and including a plurality of openings, each opening exposing at least a portion of each of the first electrodes, wherein the emitting patterns are in respective ones of the openings.

The auxiliary electrode may be covered by the pixel defining layer in each of the margin areas, and the auxiliary electrode may be exposed by the pixel defining layer in each of the contact areas so as to be in contact with the second electrode.

The pixel defining layer may overlap with the margin areas, and the first charge control layer, the second charge control layer, and the pixel defining layer may be between the auxiliary electrode and the second electrode in each of the margin areas.

The display panel may further include a plurality of dummy patterns on the pixel defining layer in the margin area and including a light emitting material, wherein the dummy patterns and the contact areas are alternately arranged in the first direction.

The first electrodes of the organic light emitting elements are spaced apart from each other and are arranged in a matrix form including rows arranged along the first direction and columns arranged along the second direction, and the second electrodes of the organic light emitting elements may be connected to each other to constitute a single body shape.

The contact areas and the margin areas may correspond to the rows, respectively.

Each of the margin areas may be adjacent to a plurality of first electrodes, and each of the contact areas may be adjacent to one first electrode.

Each of the contact areas may be adjacent to a plurality of first electrodes, and each of the margin areas may be adjacent to one first electrode.

The auxiliary electrode may be on the same layer as the first electrode and may be spaced apart from the first electrode when viewed in a plan view.

The display panel may further include a seal area adjacent to the edge area and including a seal therein, wherein the seal area surrounds the edge area.

The embodiments may be realized by providing a display panel including a base substrate including an active area; an edge area adjacent to the active area and including margin areas and contact areas alternately arranged in a first direction; and a seal area adjacent to the edge area; a plurality of first electrodes in the active area; an auxiliary electrode in the edge area and spaced apart from the first electrodes in a plan view, the auxiliary electrode facing the first electrodes in a second direction that intersects the first direction; a pixel defining layer on the base substrate and including a plurality of openings exposing the first electrodes, respectively; a plurality of emitting patterns in the openings, respectively; and a second electrode overlapping with the plurality of emitting patterns and on the pixel defining layer, wherein the second electrode is spaced apart from the auxiliary electrode in the margin areas and is in contact with the auxiliary electrode in the contact areas, and wherein each of the contact areas and the margin areas overlaps with one of the first electrodes in the second direction.

The contact areas may not overlap with the margin areas in the second direction.

The display panel may further include a first charge control layer between the first electrodes and the emitting patterns; and a second charge control layer between the second electrode and the emitting patterns, wherein the first charge control layer and the second charge control layer overlap with the margin areas and do not overlap with the contact areas.

The auxiliary electrode may be covered by the pixel defining layer in each of the margin areas and may be exposed by the pixel defining layer in each of the contact areas so as to contact the second electrode.

Each of the emitting patterns may have a quadrilateral shape that has a side extending in the first direction and a side extending in the second direction in a plan view.

Each of the emitting patterns may have a diamond shape that has a diagonal line extending in the first direction and a diagonal line extending in the second direction.

The display panel may further include dummy patterns in the margin areas, the dummy patterns including a same material as the emitting patterns, wherein the dummy patterns and the contact areas are alternately arranged in the first direction.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
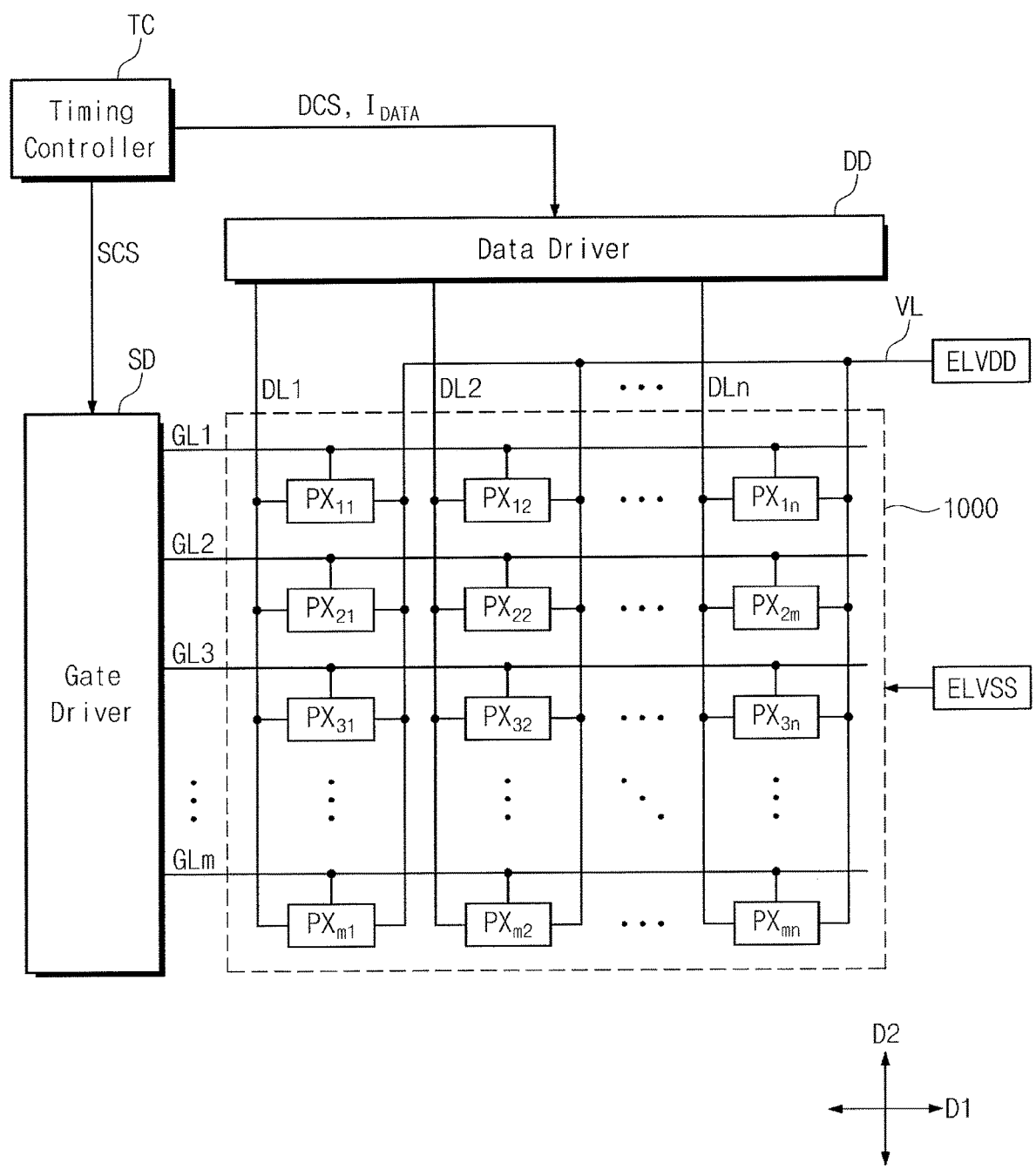
FIG. 1 illustrates a block diagram of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference characters refer to like elements throughout.

Figure 2:
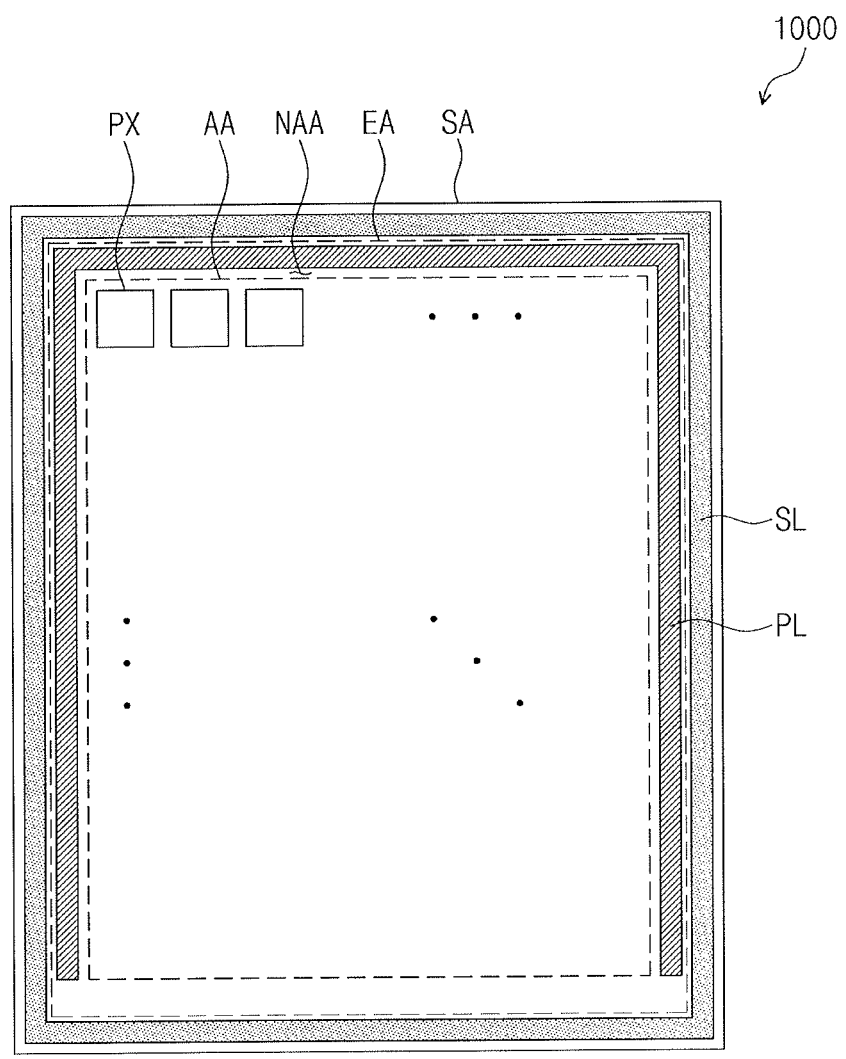
FIG. 2 illustrates a schematic plan view of a display panel of FIG. 1.

FIG. 1 illustrates a block diagram of a display device according to an embodiment. FIG. 2 illustrates a schematic plan view of a display panel of FIG. 1. Hereinafter, a display device according to an embodiment will be described with reference to FIGS. 1 and 2.

The display device may display an image by electrical signals applied thereto. The display device may be an organic light emitting display device, an electrophoretic display device, an electrowetting display device, a liquid crystal display device, or a plasma display device and may be driven by at least one of various methods to display an image. In the present embodiment, the organic light emitting display device is described as an example of the display device. For example, the display device may include a timing controller TC, a gate driver SD, a data driver DD, and an organic light emitting display panel 1000 (hereinafter, referred to as 'a display panel 1000').

The timing controller TC may receive input image signals and may output converted image data $I_{DATA}$ appropriate to an operation mode of the display panel 1000 and various control signals SCS and DCS.

The gate driver SD may receive a gate driving control signal SCS from the timing controller TC. The gate driver SD supplied with the gate driving control signal SCS may generate a plurality of gate signals. The gate signals may be sequentially supplied to the display panel 1000.

The data driver DD may receive a data driving control signal DCS and the converted image data $I_{DATA}$ from the timing controller TC. The data driver DD may generate a plurality of data signals on the basis of the data driving control signal DCS and the converted image data $I_{DATA}$. The data signals may be supplied to the display panel 1000.

The display panel 1000 may display an image by electrical signals applied thereto. The display panel 1000 may include a plurality of gate lines GL1 to GLm, a plurality of data lines DL1 to DLn, and a plurality of pixels $PX_{11}$ to $PX_{mn}$.

The gate lines GL1 to GLm may extend in a first direction D1 and may be arranged in a second direction D2 intersecting the first direction D1. The gate lines GL1 to GLm may be sequentially supplied with the gate signals from the gate driver SD.

The data lines DL1 to DLn may intersect the gate lines GL1 to GLm and may be insulated from the gate lines GL1 to GLm. The data lines DL1 to DLn may extend in the second direction D2 and may be arranged in the first direction D1. The data lines DL1 to DLn may receive the data signals from the data driver DD.

The pixels $PX_{11}$ to $PX_{mn}$ may be arranged in a matrix form along the first direction D1 and the second direction D2. Each of the pixels $PX_{11}$ to $PX_{mn}$ may be connected to a corresponding one of the gate lines GL1 to GLm and a corresponding one of the data lines DL1 to DLn.

Each of the pixels $PX_{11}$ to $PX_{mn}$ may receive the gate signal from the corresponding gate line and may receive the data signal from the corresponding data line. Each of the pixels $PX_{11}$ to $PX_{mn}$ may be turned-on in response to the received gate signal. Each of the pixels $PX_{11}$ to $PX_{mn}$ may generate light corresponding to the received data signal to display an image.

The display panel 1000 may be supplied with a first power source voltage ELVDD and a second power source voltage ELVSS. Each of the pixels $PX_{11}$ to $PX_{mn}$ may be turned-on in response to the received gate signal. Each of the pixels $PX_{11}$ to $PX_{mn}$ may receive the first power source voltage ELVDD and the second power source voltage ELVSS and may generate light in response to the received data signal.

A level of the first power source voltage ELVDD may be higher than a level of the second power source voltage ELVSS. The first power source voltage ELVDD may be applied to the pixels $PX_{11}$ to $PX_{mn}$ through a first power line VL. The second power source voltage ELVSS may be fully provided to the display panel 1000. The second power source voltage ELVSS may be provided through a second power line PL to be described below. In an implementation, the second power source voltage ELVSS may be applied through the first power line VL, depending on a component of each of the pixels $PX_{11}$ to $PX_{mn}$.

Referring to FIG. 2, an active area AA and a peripheral area NAA may be defined in the display panel 1000. For the purpose of ease and convenience in description and illustration, some components may be omitted and the pixels are indicated by a single reference character PX, in FIG. 2. The pixels PX may be disposed in the active area AA, and the active area AA may display an image by the pixels.

The peripheral area NAA may be adjacent to the active area AA. In an implementation, the peripheral area NAA has a frame shape that surrounds the active area AA when viewed in a plan view.

The peripheral area NAA may include a seal area SA and an edge area EA. The seal area SA may be an area in which a seal SL is disposed. The seal SL may seal the active area AA to help prevent the pixels PX from being damaged by an external environment. The seal SL may be disposed along an edge of the display panel 1000.

The edge area EA may be adjacent to at least one side of the active area AA. The edge area EA may be an area in which the second power line PL is disposed. The edge area EA may be defined along a shape of the second power line PL.

The second power line PL may provide the second power source voltage ELVSS, provided from the outside, to the active area AA. The second power line PL may be connected to the pixels PX in the edge area EA to provide the second power source voltage ELVSS to an entire active area AA. In an implementation, the second power line PL has a shape that surrounds three sides of the active area AA. In an implementation, the second power line PL may have a shape adjacent to one side of the active area AA or may have shapes respectively adjacent to two sides, spaced apart from each other, of the active area AA.

In an implementation, the display panel 1000 may further include one or more auxiliary electrode patterns that extend from the second power line PL into the active area AA. The auxiliary electrode patterns may provide the second power source voltage ELVSS to an area far away from the edge area EA. For example, a voltage drop phenomenon according to a position in the active area AA may be prevented and the display panel 1000 may have uniform brightness in the entire active area AA.

Figure 3:
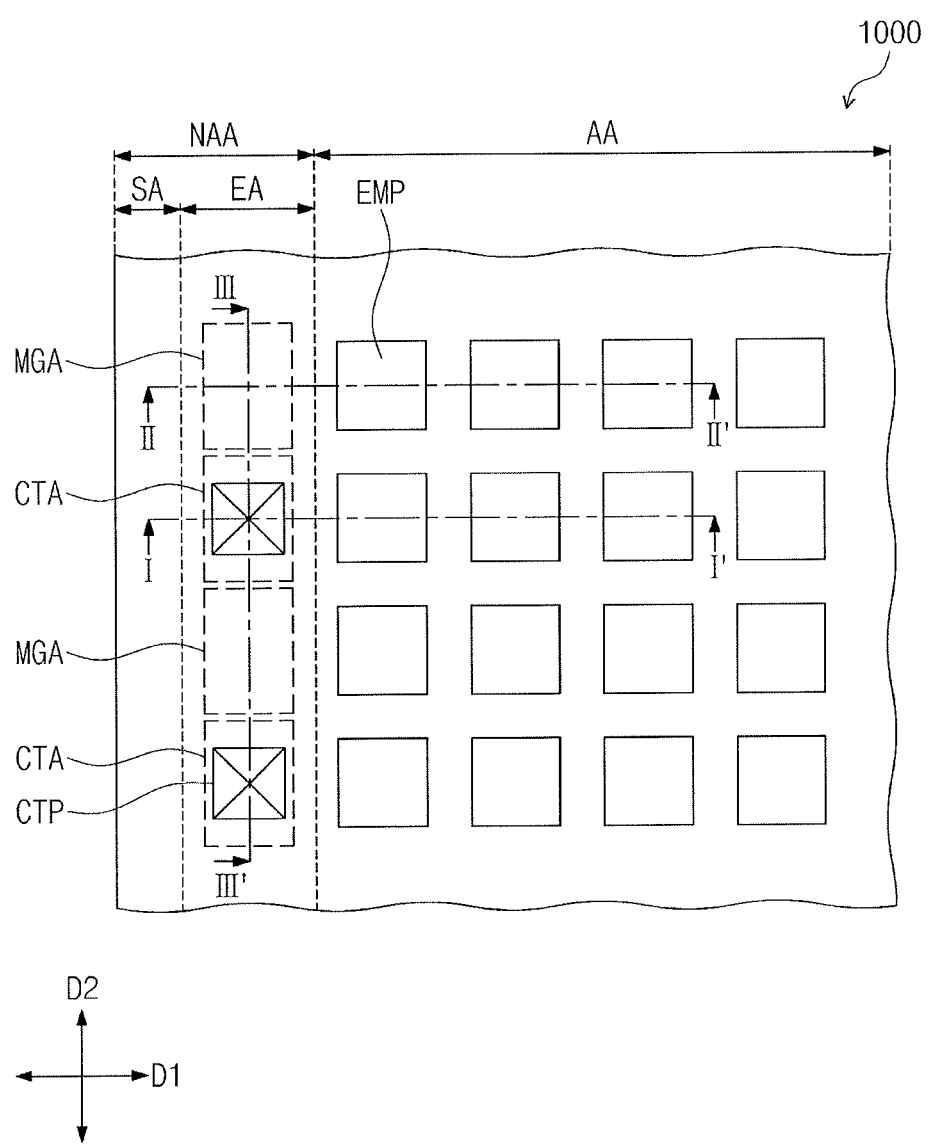
FIG. 3 illustrates an enlarged plan view of a portion of the display panel of FIG. 2.
Figure 4A:
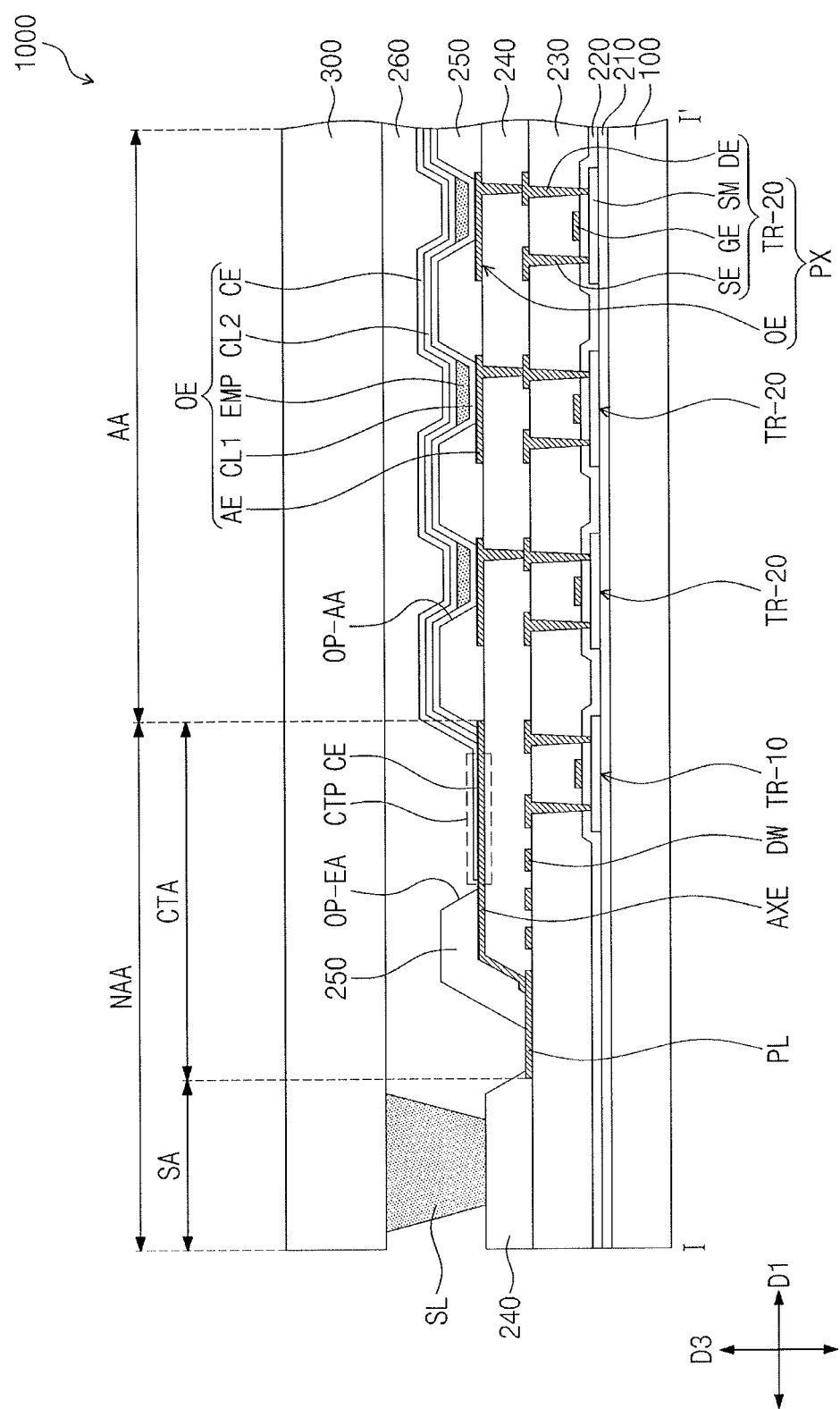
FIG. 4A illustrates a cross-sectional view taken along a line I-I' of FIG. 3.
Figure 4B:
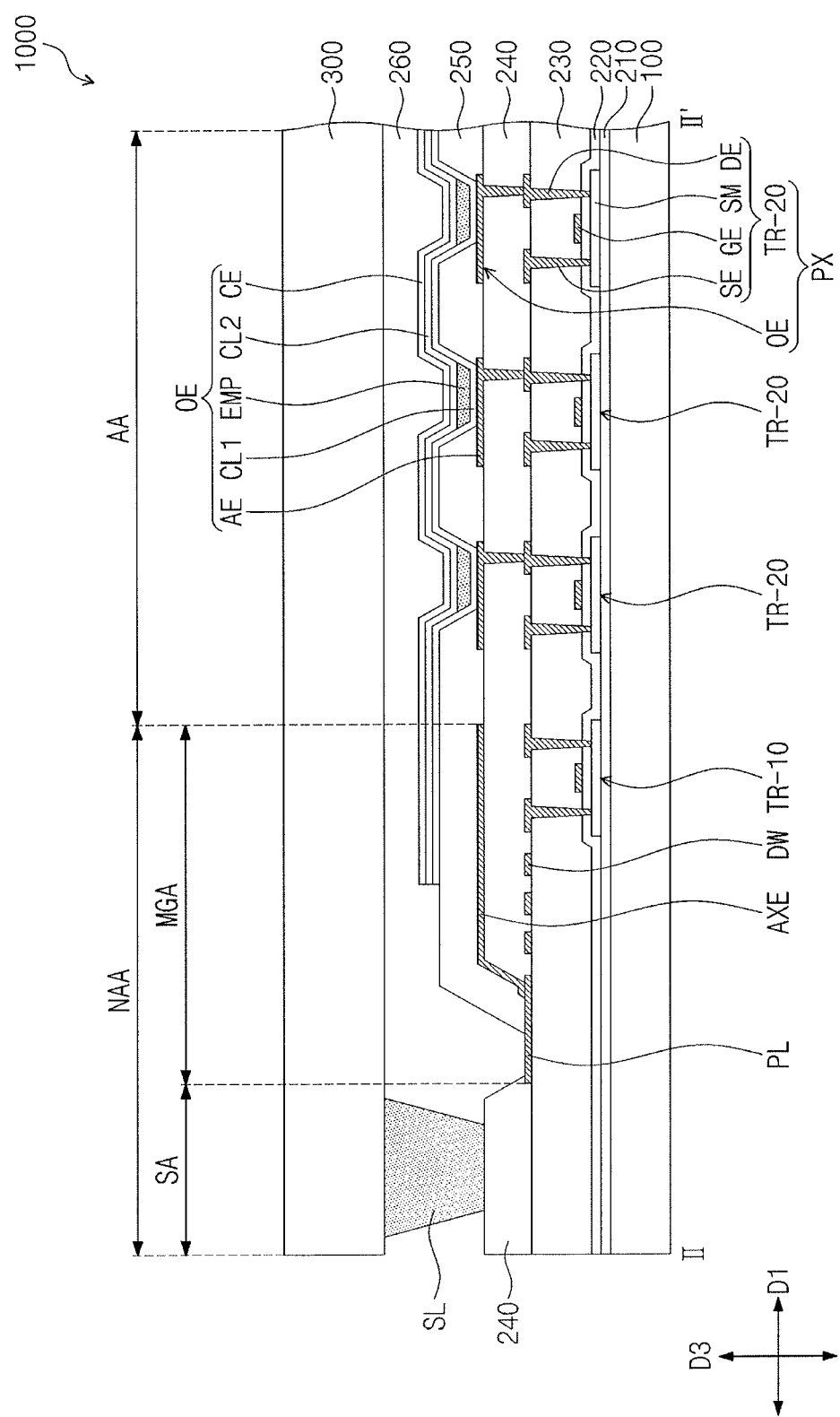
FIG. 4B illustrates a cross-sectional view taken along a line II-II' of FIG. 3.
Figure 4C:
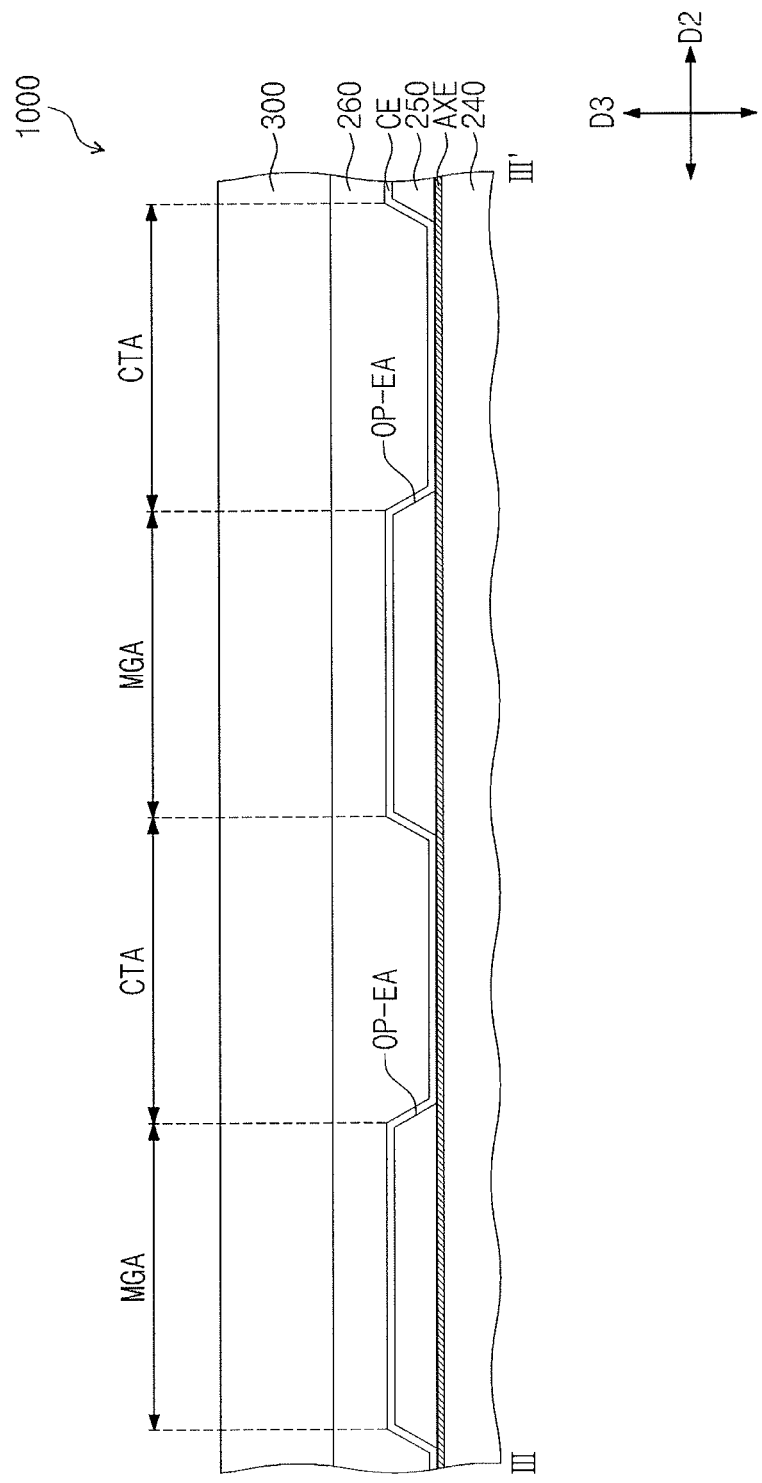
FIG. 4C illustrates a cross-sectional view taken along a line of III-III' FIG. 3.

FIG. 3 illustrates an enlarged plan view of a portion of the display panel of FIG. 2. FIG. 4A illustrates a cross-sectional view taken along a line I-I' of FIG. 3. FIG. 4B illustrates a cross-sectional view taken along a line II-II' of FIG. 3. FIG. 4C illustrates a cross-sectional view taken along a line III-III' of FIG. 3. Hereinafter, the display panel 1000 according to an embodiment will be described in more detail with reference to FIGS. 3 and 4A to 4C.

As illustrated in FIG. 3, a plurality of emitting patterns EMP may be in the active area AA. Each of the emitting patterns EMP may have a quadrilateral shape including sides extending in the first direction D1 and sides extending in the second direction D2. Each of the emitting patterns EMP may display and/or generate light and may define a light emitting area. The emitting patterns EMP may correspond to the pixels PX, respectively, and may correspond to first electrodes AE to be described below in more detail.

The seal area SA, the edge area EA, and the active area AA may be sequentially arranged in the first direction D1. A portion of the edge area EA, which extends (e.g., lengthwise) in the second direction D2, is illustrated in FIG. 3.

The edge area EA may include a plurality of contact areas CTA and a plurality of margin areas M. The contact areas CTA and the margin areas MGA may be arranged in the second direction D2 (e.g., may be alternately or repeatedly provided aligned in the second direction D2). Each of the contact and margin areas CTA and MGA may be disposed adjacent to the active area AA.

Each of the contact areas CTA and margin areas MGA may be adjacent to respective ones of the emitting patterns EMP that are adjacent to the edge area EA. Each of the contact and margin areas CTA and MGA may face or be aligned with respective ones of the emitting patterns EMP that are adjacent or proximate to the edge area EA, in the first direction D1.

In an implementation, each of the contact areas CTA and margin areas MGA may overlap with respective ones of the emitting patterns EMP when viewed in the first direction D1, and the each of the contact areas CTA and margin areas MGA and respective ones of the emitting patterns EMP may be arranged or aligned in or along a line in the first direction D1. The contact areas CTA and the margin areas MGA may not overlap with each other (e.g., may be spaced apart from one another) when viewed in the first direction D1. For example, the emitting patterns EMP may overlap with a corresponding one of the contact area CTA and the margin area MGA in the first direction D1, and may not overlap with other ones of the contact area CTA and the margin area MGA in the first direction D1. The emitting patterns EMP (or the pixels PX) adjacent to the edge area EA may selectively overlap with corresponding ones of the contact area CTA and the margin area MGA when viewed in the first direction D1.

The embodiment will be described in more detail with reference to FIGS. 4A and 4B. Hereinafter, a singular pixel PX will be mainly described for the purpose of ease and convenience in description. The pixel PX may include a thin film transistor TR-20 and an organic light emitting element OE. The organic light emitting element OE may be connected to the thin film transistor TR-20.

The thin film transistor TR-20 may be on a base substrate 100. The thin film transistor TR-20 may include a semiconductor pattern SM, a control electrode GE, an input electrode SE, and an output electrode DE.

A first insulating layer 210 may be on the base substrate 100. The semiconductor pattern SM may be between the first insulating layer 210 and a second insulating layer 220 on the first insulating layer 210. The control electrode GE may be between the second insulating layer 220 and a third insulating layer 230 on the second insulating layer 220. The control electrode GE may be spaced apart from the semiconductor pattern SM with the second insulating layer 220 interposed therebetween, when viewed in a cross-sectional view.

The input electrode SE and the output electrode DE may be between the third insulating layer 230 and a fourth insulating layer 240 on the third insulating layer 230. The input electrode SE and the output electrode DE may be on the same layer and may be spaced apart from each other when viewed in a plan view. Each of the input electrode SE and the output electrode DE may penetrate the second and third insulating layers 220 and 230 so as to be connected to a portion of the semiconductor pattern SM. In an implementation, the structure of the thin film transistor TR-20 may be variously modified.

The organic light emitting element OE may be on the fourth insulating layer 240. The fourth insulating layer 240 may be on the thin film transistor TR-20. A portion of the organic light emitting element OE may penetrate the fourth insulating layer 240 so as to be connected to the output electrode DE of the thin film transistor TR-20. The organic light emitting element OE may include a first electrode AE, a second electrode CE, the emitting pattern EMP, a first charge control layer CL1, and a second charge control layer CL2.

The first electrode AE may be on the fourth insulating layer 240. The first electrode AE may be spaced apart from a first electrode of an adjacent pixel when viewed in a plan view. A material of the first electrode AE may be variously changed depending on a light emitting direction of the display panel 1000. For example, when the display panel 1000 is a front surface light emitting type, the first electrode AE may include a reflective metal such as silver, gold, or platinum. In an implementation, when the display panel 1000 is a rear surface light emitting type, the first electrode AE may include a transmissive conductive material such as a transparent conductive oxide (TCO).

The emitting pattern EMP may be on the first electrode AE. The emitting pattern EMP may be in a corresponding one of a plurality of openings OP-AA defined in the pixel defining layer 250. The emitting pattern EMP may include a light emitting material. For example, the emitting pattern EMP may include at least one of materials emitting red light, green light and blue light and may include a fluorescent material or a phosphorescent material.

The emitting pattern EMP may have a single-layered structure formed of a single material, a single-layered structure formed of different materials from each other, or a multi-layered structure including a plurality of layers formed of different materials from each other. For example, the emitting pattern EMP may generate light having one of a red color, a green color and a blue color or may generate light having a mixed color of two or more of the red color, the green color and the blue color. In an implementation, the emitting patterns EMP of adjacent pixels may generate lights of different colors from each other or light of the same color.

The second electrode CE may be disposed on the emitting pattern EMP. The second electrode CE may have a single body shape overlapping with the first electrodes AE adjacent to each other and the emitting patterns EMP adjacent to each other. Thus, the pixels PX may share the second electrode CE.

The second electrode CE may face the first electrode AE. For example, when the first electrode AE is an anode, the second electrode CE may be a cathode. In an implementation, the second electrode CE may be formed of a material having a low work function to easily inject electrons. In an implementation, when the first electrode AE is a cathode, the second electrode CE may be an anode.

The second electrode CE may include a conductive material. For example, the conductive material may be a metal, an alloy, an electrical conductive compound, or any combination thereof. In an implementation, the second electrode CE may include at least one of (e.g., light) transmissive materials such as indium tin oxide, indium zinc oxide, zinc oxide, and indium tin zinc oxide.

The second electrode CE may be a single layer or a multi-layer. The multi-layer may include at least one of a layer formed of a reflective material and a layer formed of a transmissive material.

The second electrode CE may be spaced apart from the first electrode AE with the emitting pattern EMP interposed therebetween, when viewed in a cross-sectional view. In the organic light emitting element OE, the emitting pattern EMP may be activated by a potential difference between the first and second electrodes AE and CE to generate light.

The first charge control layer CL1 may be between the first electrode AE and the emitting pattern EMP. The first charge control layer CL1 may have a single body shape overlapping with the first electrodes AE adjacent to each other and the emitting patterns EMP adjacent to each other. Thus, the pixels PX may share the first charge control layer CL1.

The first charge control layer CL1 may control movement of charges from the first electrode AE toward the emitting pattern EMP. For example, the first charge control layer CL1 may include a hole transfer region which controls movement of holes. The first charge control layer CL1 may include at least one of a hole injection layer, a hole transfer layer, and a single layer having both a hole injection function and a hole transfer function. For example, the first charge control layer CL1 may include at least one of a hole injection material and a hole transfer material. Each of the hole injection material and the hole transfer material may include a suitable material.

In an implementation, the first charge control layer CL1 may further include a hole blocking layer. In this case, the first charge control layer CL1 may block holes moving from the emitting pattern EMP toward the first electrode AE. When the first charge control layer CL1 includes the hole blocking layer, the first charge control layer CL1 may include a suitable hole blocking material. In an implementation, the first charge control layer CL1 may further include a charge generating material. The charge generating material may be uniformly dispersed in the first charge control layer CL1 to form a single region or may be non-uniformly dispersed to divide the first charge control layer CL1 into a plurality of regions.

The second charge control layer CL2 may be between the second electrode CE and the emitting pattern EMP. The second charge control layer CL2 may have a single body shape overlapping with the first electrodes AE adjacent to each other and the emitting patterns EMP adjacent to each other. Thus, the pixels PX may share the second charge control layer CL2.

The second charge control layer CL2 may help control movement of charges from the second electrode CE toward the emitting pattern EMP. For example, the second charge control layer CL2 may include an electron transfer region that helps control movement of electrons. The second charge control layer CL2 may include at least one of an electron injection layer, an electron transfer layer, and a single layer having both an electron injection function and an electron transfer function. For example, the second charge control layer CL2 may include at least one of an electron injection material and an electron transfer material. Each of the electron injection material and the electron transfer material may include suitable materials. The first charge control layer CL1, the emitting pattern EMP and the second charge control layer CL1 may be organic layers.

A cover substrate 300 may be on the base substrate 100. The cover substrate 300 may cover the active area AA and the peripheral area NAA. The cover substrate 300 may be spaced apart from the pixels PX with an encapsulation part 260 interposed therebetween.

Driving circuits may be disposed in the peripheral area NAA. The driving circuits may provide driving signals to the pixels PX of the active area AA. The driving circuits may include at least one of the gate driver SD (see FIG. 1) and the data driver DD (see FIG. 1).

In the present embodiment, a driving transistor TR-10 and driving lines DW of the driving circuits are illustrated for the purpose of ease and convenience in description and illustration. The driving transistor TR-10 may be disposed in the peripheral area NAA. In the present embodiment, the driving transistor TR-10 has the same structure as the thin film transistor TR-20 of the active area AA. In an implementation, the structure of the driving transistor TR-10 may be different from that of the thin film transistor TR-20 of the active area AA. The driving lines DW may connect elements in the driving circuits and/or may connect the driving circuits to the pixels PX of the active area AA.

As described above, the peripheral area NAA may include the seal area SA and the edge area EA. The seal area SA may be spaced apart from the active area AA with the edge area EA therebetween.

As described above, the seal SL may be in the peripheral area NAA to define the seal area SA. The seal SL may be along an edge of the base substrate 100. The seal SL may be on the fourth insulating layer 240. The seal SL may be between the base substrate 100 and the cover substrate 300 to support or maintain a cell-gap between the base substrate 100 and the cover substrate 300 and to couple the base substrate 100 and the cover substrate 300 to each other.

The seal SL may seal the active area AA. The encapsulation part 260 may include a non-active material. The seal SL may help prevent permeation of an external environment into the active area AA and may thus protect the pixels PX.

As described above, the second power line PL (hereinafter, referred to as 'a power line') may be disposed in the peripheral area NAA to define the edge area EA. The power line PL may be disposed between the third insulating layer 230 and the fourth insulating layer 240. At least a portion of the power line PL may be exposed by the fourth insulating layer 240. In an implementation, the power line PL may be disposed on the same layer as the input electrode SE and the output electrode DE of the thin film transistor TR-20. In an implementation, the power line PL may be disposed on another layer.

An auxiliary electrode AXE may be in the peripheral area NAA to define the edge area EA. The auxiliary electrode AXE may be between the fourth insulating layer 240 and the pixel defining layer 250. In an implementation, the auxiliary electrode AXE may be disposed on the same layer as the first electrode AE of the organic light emitting element OE.

The auxiliary electrode AXE may be connected to the power line PL. The auxiliary electrode AXE may be in direct contact with the portion of the power line PL, which is exposed by the fourth insulating layer 240.

The auxiliary electrode AXE may be connected to the second electrode CE in the edge area EA. The auxiliary electrode AXE may electrically connect the power line PL to the second electrode CE. Thus, the second power source voltage ELVSS (see FIG. 1) supplied from the outside through the power line PL may be stably provided to the active area AA through the auxiliary electrode AXE and the second electrode CE.

In an implementation, the auxiliary electrode AXE may be connected to the second electrode CE in a partial area of the edge area EA. The edge area EA may include the contact areas CTA and the margin areas MGA, which are classified according to whether the auxiliary electrode AXE is connected to the second electrode CE in a corresponding area.

Referring to FIGS. 3 and 4A, the contact areas CTA may be arranged in the second direction D2 and may be spaced apart from each other. The auxiliary electrode AXE may be in contact with the second electrode CE in each of the contact areas CTA.

The pixel defining layer 250 on the auxiliary electrode AXE may further include an edge opening OP-EA defined in the edge area EA. The edge opening OP-EA defined in the edge area EA may expose at least a portion of the auxiliary electrode AXE. The second electrode CE on the pixel defining layer 250 may extend from the active area AA into the edge area EA and may be in contact with the auxiliary electrode AXE through the edge opening OP-EA defined in the edge area EA.

A contact portion CTP of the auxiliary electrode AXE and the second electrode CE may be formed in each of the contact areas CTA and may be defined in the edge opening OP-EA. In an implementation, the first and second charge control layers CL1 and CL2 may not overlap with the contact portion CTP in each of the contact areas CTA when viewed in a plan view.

In an implementation, the contact portion CTP between the auxiliary electrode AXE and the second electrode CE may be provided in plurality. For example, a plurality of the contact areas CTA may be provided, and the contact portions CTP may be provided in the contact areas CTA, respectively. The number of the contact areas CTA may increase, and a resistance variation according to an area of the second electrode CE having the single body shape may be reduced or minimized. For example, it is possible to realize or provide the display panel 1000 having substantially uniform brightness in the entire active area AA.

Referring to FIGS. 3 and 4B, the margin areas MGA may be arranged in the second direction D2 and may be spaced apart from each other. The auxiliary electrode AXE may be spaced apart from the second electrode CE in each of the margin areas MGA. For example, the auxiliary electrode AXE may not be in contact with the second electrode CE in each of the margin areas MGA.

The pixel defining layer 250 may insulate the auxiliary electrode AXE and the second electrode CE from each other in each of the margin areas MGA. The auxiliary electrode AXE may be completely covered by the pixel defining layer 250 in each of the margin areas MGA.

In an implementation, at least one of the first and second charge control layers CL1 and CL2 may extend from the active area AA into the edge area EA. The first and second charge control layers CL1 and CL2 may be disposed between the second electrode CE and the auxiliary electrode AXE in each of the margin areas MGA.

Referring to FIGS. 3 and 4C, the margin areas MGA and the contact areas CTA may be alternately arranged in the second direction D2. The layers under the fourth insulating layer 240 and portions of the first and second charge control layers CL1 and CL2 are omitted in FIG. 4C for the purpose of ease and convenience in description and illustration.

The edge openings OP-EA defined in the pixel defining layer 250 may be disposed in the edge area EA and may be arranged in the second direction D2. The contact areas CTA may be defined to correspond to the edge openings OP-EA, respectively, and the margin areas MGA may be defined in an area except for or outside the edge openings OP-EA.

In an implementation, the contact areas CTA and the margin areas MGA may be discontinuously arranged in the second direction D2. For example, the contact areas CTA and the margin areas MGA may be provided together in one edge area EA extending in the second direction D2. In an implementation, the contact areas CTA for the contact portions CTP of the second electrode CE and the auxiliary electrode AXE may be provided in portions of a margin area which does not affect the active area AA, and an effect of substantially reducing the peripheral area NAA may be obtained. As a result, a bezel area of the display panel 1000 may be reduced, and the active area AA of the display panel 1000 may be relatively increased.

Figure 5A:
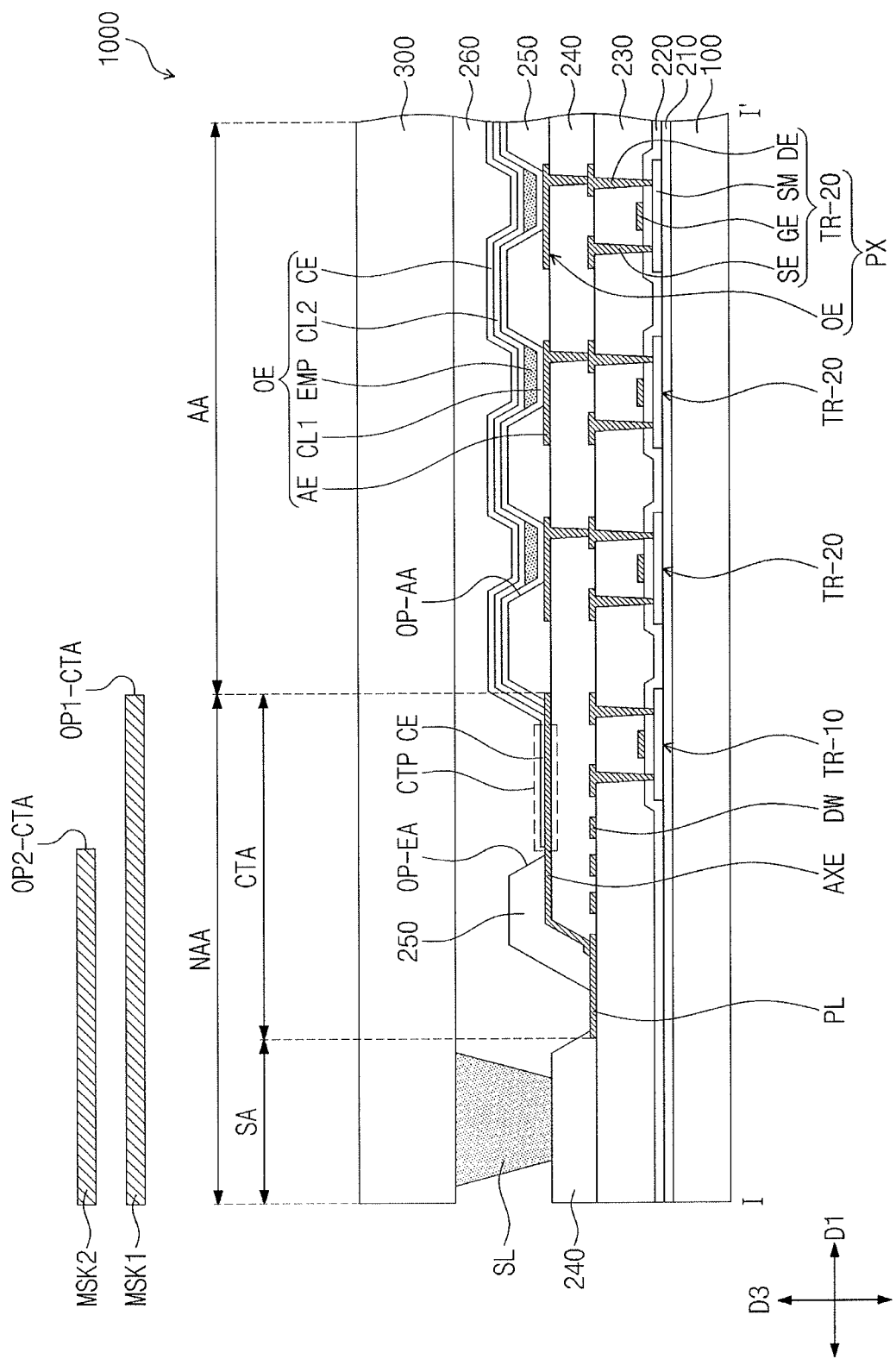
FIGS. 5A and 5B illustrate cross-sectional views of portions of a display panel according to an embodiment.
Figure 5B:
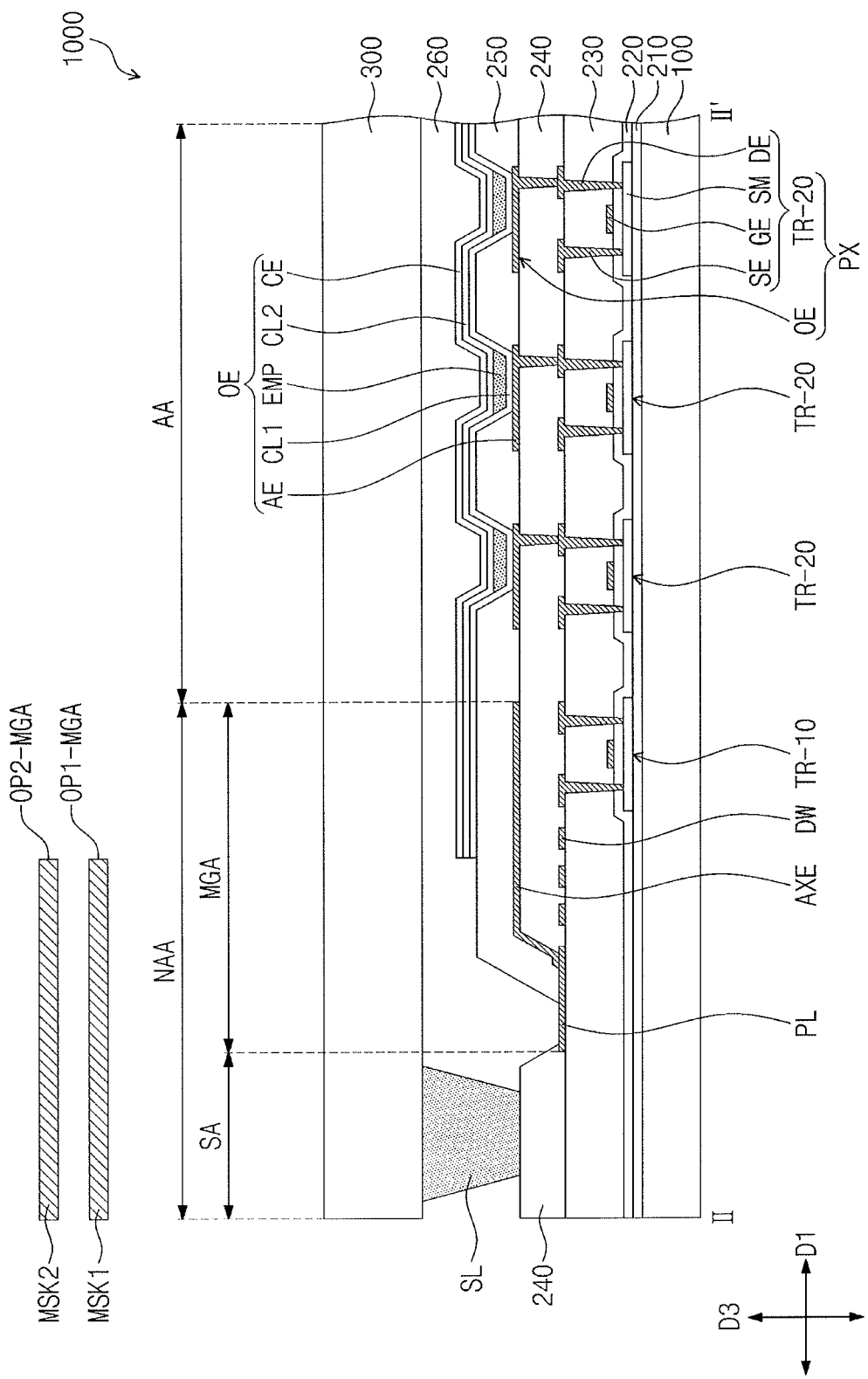
Figure 5C:
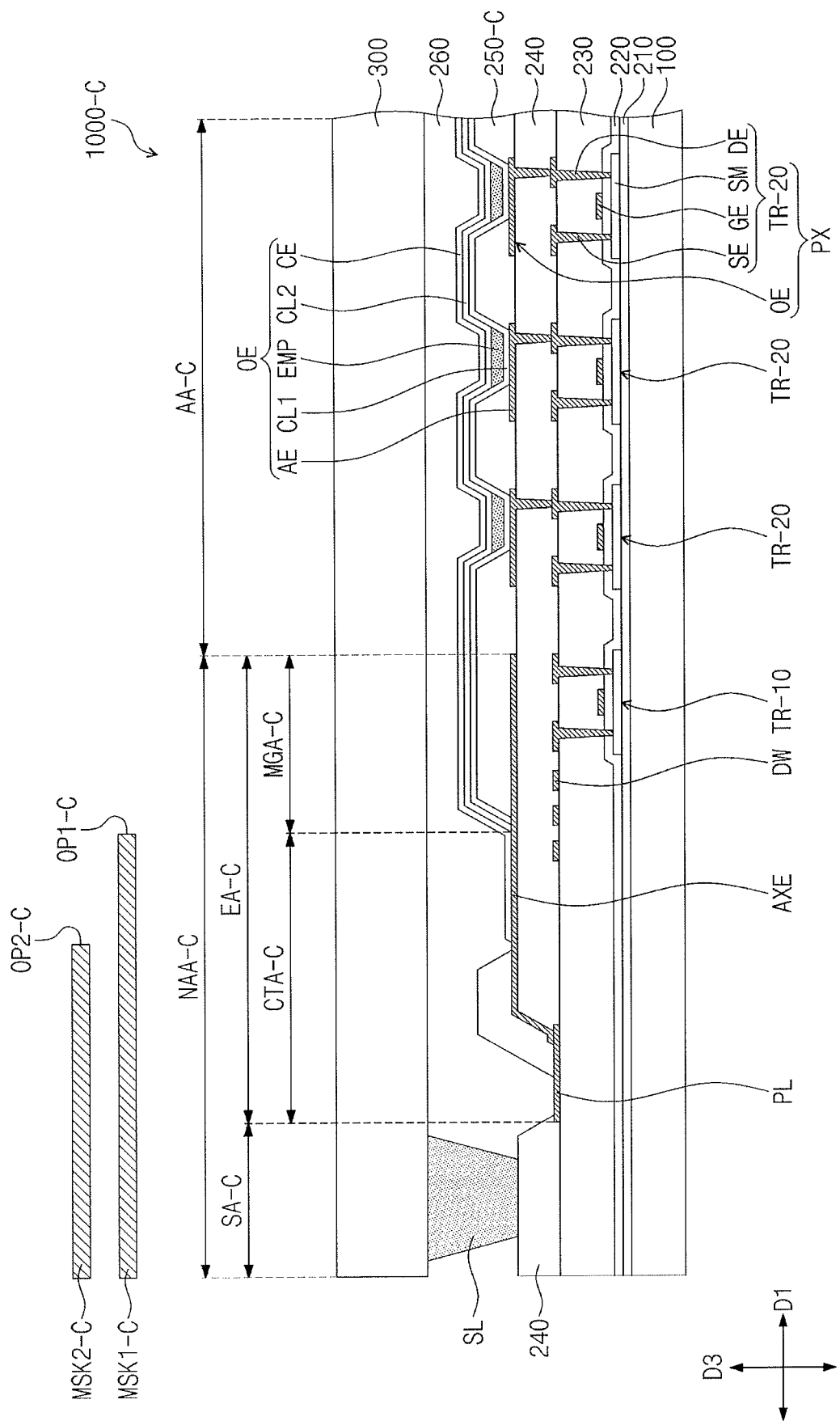
FIG. 5C illustrates a cross-sectional view of a portion of a display panel according to a comparative example.

FIGS. 5A and 5B illustrate cross-sectional views of portions of a display panel according to an embodiment. FIG. 5C illustrates a cross-sectional view of a portion of a display panel according to a comparative example. For the purpose of ease and convenience in description, FIGS. 5A to 5C illustrate corresponding areas, and masks used in manufacturing processes are also illustrated in FIGS. 5A to 5C. Hereinafter, the embodiments will be described with reference to FIGS. 5A to 5C. The same components as described with reference to FIGS. 1 to 4C will be indicated by the same reference characters, and the descriptions thereto may be omitted or mentioned briefly.

As illustrated in FIGS. 5A and 5B, the display panel 1000 according to an embodiment may include the contact area CTA and the margin area MGA that are alternately arranged in one direction in the peripheral area NAA. The area illustrated in the FIG. 5A is substantially the same as the area illustrated in FIG. 4A, and the area illustrated in FIG. 5B is substantially the same as the area illustrated in FIG. 4B.

As illustrated in FIG. 5A, a first mask MSK1 and a second mask MSK2 may be used to manufacture the display panel 1000. The first mask MSK1 and the second mask MSK2 may be provided for or at different times from each other. The first and second masks MSK1 and MSK2 are illustrated together for the purpose of ease and convenience in description.

The first mask MSK1 may be an open mask that is used to deposit the first charge control layer CL1 and the second charge control layer CL2. An opening OP1-CTA of the first mask MSK1 may be substantially the same as the active area AA. Thus, each of the first and second charge control layers CL1 and CL2 may be formed to have a single body (e.g., continuous) shape covering the entire active area AA. Portions of the first and second charge control layers CL1 and CL2 may be deposited in a partial area of the contact area CTA (e.g., at an inner edge of the contact area CTA). This may be due to a margin according to radial deposition.

The second mask MSK2 may be an open mask that is used to deposit the second electrode CE. An opening OP2-CTA of the second mask MSK2 may be greater than the active area AA (e.g., may have a size greater than that of the active area AA). For example, the opening OP2-CTA of the second mask MSK2 may also expose a portion of the peripheral area NAA. The opening OP2-CTA of the second mask MSK2 may expose at least a portion of the contact area CTA. For example, the second electrode CE may be deposited in the contact area CTA as well as the active area AA so as to be formed on a top surface of the auxiliary electrode AXE exposed by the edge opening OP-EA.

As illustrated in FIG. 5B, shapes of openings of the first and second masks MSK1 and MSK2 in an area corresponding to the margin area MGA may be different from those of the openings of the first and second masks MSK1 and MSK2 in the area corresponding to the contact area CTA.

The (e.g., size of the) opening OP1-MGA of the first mask MSK1 in the area corresponding to the margin area MGA may be greater than in the area corresponding to the active area AA. The opening OP1-MGA of the first mask MSK1 may expose at least a portion of the margin area MGA of the peripheral area NAA. For example, the first and second charge control layers CL1 and CL2 may also be deposited in the margin area MGA to overlap with a portion of the auxiliary electrode AXE.

In an implementation, the (e.g., size of the) opening OP2-MGA of the second mask MSK2 in the area corresponding to the margin area MGA may be greater than (or about equal to) in the area corresponding to the active area AA. The opening OP2-MGA of the second mask MSK2 may expose at least a portion of the margin area MGA of the peripheral area NAA. The opening OP2-MGA of the second mask MSK2 corresponding to the margin area MGA may have substantially the same shape as the opening OP2-CTA of the second mask MSK2 corresponding to the contact area CTA. On the contrary, the shape of the opening OP1-MGA of the first mask MSK1 corresponding to the margin area MGA may be different from the shape of the opening OP1-CTA of the first mask MSK1 corresponding to the contact area CTA.

Referring to FIG. 5C, a display panel 1000-C according to a comparative example may include a peripheral area NAA-C and an active area AA-C, and the peripheral area NAA-C may include a seal area SA-C and an edge area EA-C. The active area AA-C and the seal area SA-C may substantially correspond to those of the display panel 1000 of FIGS. 5A and 5B, and thus descriptions thereto may be omitted.

The edge area EA-C of the display panel 1000-C according to the comparative example may include a contact area CTA-C and a margin area MGA-C. The contact area CTA-C and the margin area MGA-C of the display panel 1000-C according to the comparative example may be arranged in or aligned along the first direction D1. For example, in the display panel 1000-C according to the comparative example, the contact area CTA-C and the margin area MGA-C overlap with each other when viewed in or along the first direction D1. Thus, a width in the first direction D1 of the edge area EA-C of the display panel 1000-C according to the comparative example may be a sum of a width of the contact area CTA-C in the first direction D1 and a width of the margin area MGA-C in the first direction D1.

Referring to FIG. 5C, a shape of an opening OP1-C of a first mask MSK1-C for forming first and second charge control layers CL1 and CL2 is different from that of an opening OP2-C of a second mask MSK2-C for forming a second electrode CE. Since the display panel 1000-C according to the comparative example includes the contact area CTA-C and the margin area MGA-C arranged in the first direction D1, the contact area CTA-C should be provided outside the margin area MGA-C. Thus, a size (area or width) of the peripheral area NAA-C increases in the display panel 1000-C according to the comparative example.

According to an embodiment, the contact area CTA and the margin area MGA may not overlap with each other when viewed in or along the first direction D1. For example, the contact area CTA and the margin area MGA may be alternately arranged in the second direction D2 (see FIG. 3). Thus, even though a width of the edge area EA in the first direction D1 is equal to a width of the contact area CTA in the first direction D1 or a width of the margin area MGA in the first direction D1, the display panel 1000 may include both the margin area for the first or second charge control layer CL1 or CL2 and the contact area for the connection between the second electrode CE and the auxiliary electrode AXE. As a result, according to an embodiment, the display panel having a relatively reduced bezel area and a relatively wide active area may be provided.

Figure 6:
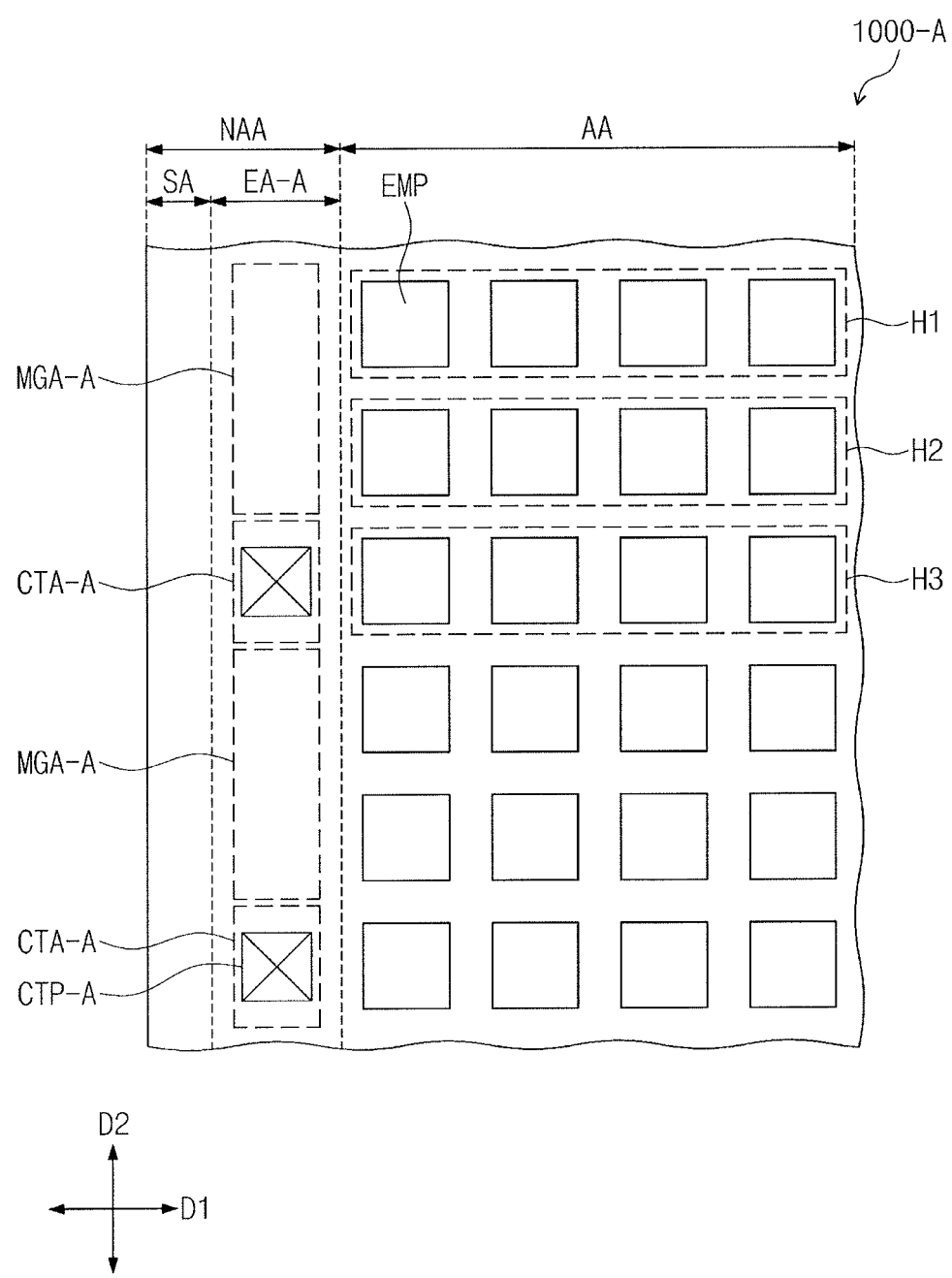
FIG. 6 illustrates a plan view of a portion of a display panel according to an embodiment.

FIG. 6 illustrates a plan view of a portion of a display panel according to an embodiment. Hereinafter, a display panel according to an embodiment will be described with reference to FIG. 6. In addition, the same components as described with reference to FIGS. 1 to 5C will indicated by the same reference characters, and the descriptions thereto may be omitted or mentioned briefly.

FIG. 6 illustrates an area corresponding to the area of FIG. 3 for the purpose of ease and convenience in description. As illustrated in FIG. 6, a display panel 1000-A may include an edge area EA-A that includes margin areas MGA-A and contact areas CTA-A arranged in or along the second direction D2. The margin areas MGA-A and the contact areas CTA-A may be alternately arranged in or along the second direction D2.

Each of the emitting patterns EMP adjacent to the edge area EA-A may face or be aligned with one of the margin area MGA-A or the contact area CTA-A in the first direction D1 and may not overlap or be aligned with the other of the margin area MGA-A or the contact area CTA-A when viewed in the first direction D1.

In the present embodiment, a size (area) of each of the margin areas MGA-A may be different from that of each of the contact areas CTA-A. For example, as illustrated in FIG. 6, the size (area) of each of the margin areas MGA-A may be greater than that of each of the contact areas CTA-A. Each of the margin areas MGA-A may face or be aligned with two of the emitting patterns EMP in the first direction D1, and each of the contact areas CTA-A may face or be aligned with one of the emitting patterns EMP in the first direction D1.

Each of the margin areas MGA-A may face and overlap with two pixel rows (e.g., first and second pixel rows H1 and H2) in the first direction D1. Each of the contact areas CTA-A may be disposed between the margin areas MGA-A and may face and overlap with one pixel row (e.g., a third pixel row H3) in the first direction D1.

According to the present embodiment, the contact area CTA-A and the margin area MGA-A may have the different sizes (e.g., the different areas) and may correspond to different numbers of the pixel rows. The arrangement of the contact areas CTA-A and the margin areas MGA-A may be variously modified under the conditions that the contact areas CTA-A and the margin areas MGA-A are alternately arranged in the second direction D2 and one pixel row overlaps with one contact area or one margin area in the first direction D1.

Figure 7:
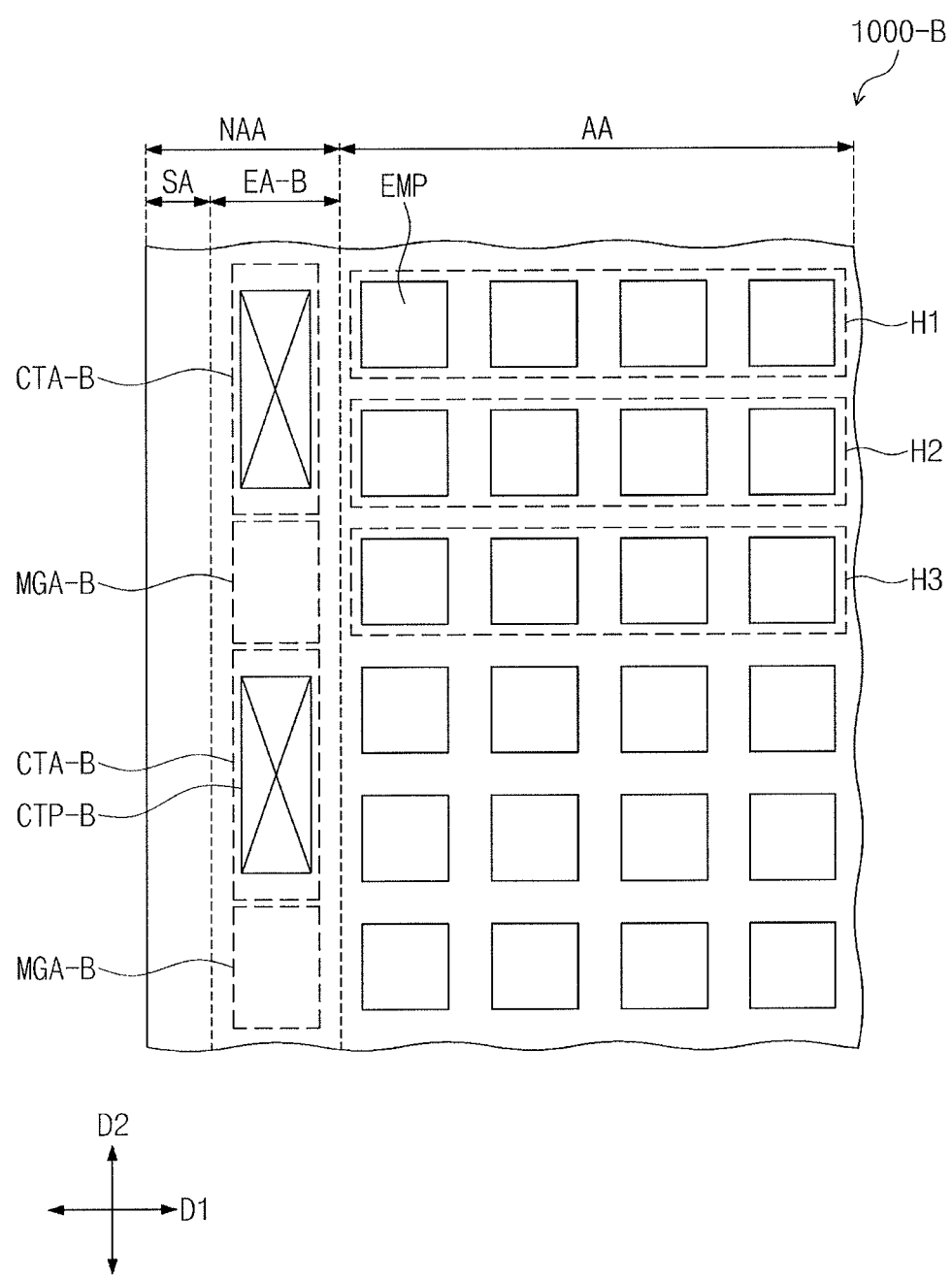
FIG. 7 illustrates a plan view of a portion of a display panel according to an embodiment.

FIG. 7 illustrates a plan view of a portion of a display panel according to an embodiment. Hereinafter, a display panel according to an embodiment will be described with reference to FIG. 7. In the present embodiment, the same components as described with reference to FIGS. 1 to 6 will be indicated by the same reference characters, and the descriptions thereto may be omitted.

FIG. 7 illustrates an area corresponding to the area of FIG. 3 for the purpose of ease and convenience in description. As illustrated in FIG. 7, a display panel 1000-B may include an edge area EA-B that includes margin areas MGA-B and contact areas CTA-B arranged in the second direction D2. The margin areas MGA-B and the contact areas CTA-B may be alternately arranged in the second direction D2.

In the present embodiment, sizes (areas) of the margin areas MGA-B may be different from those of the contact areas CTA-B, and the size (the area) of each of the margin areas MGA-B may be less than that of each of the contact areas CTA-B. Each of the contact areas CTA-B may overlap with two pixel rows (e.g., first and second pixel rows H1 and H2) when viewed in the first direction D1, and each of the margin areas MGA-B may overlap with one pixel row (e.g., a third pixel row H3) when viewed in the first direction D1. Thus, an area of the contact portion CTP formed in one contact area may substantially correspond to the area of each of the contact areas CTA-B and may be greater than an area of each of the emitting patterns EMP.

In an implementation, the arrangement of the contact areas CTA-B and the margin areas MGA-B may be variously modified under the condition that one pixel row overlaps with one contact area or one margin area in the first direction D1.

Figure 8A:
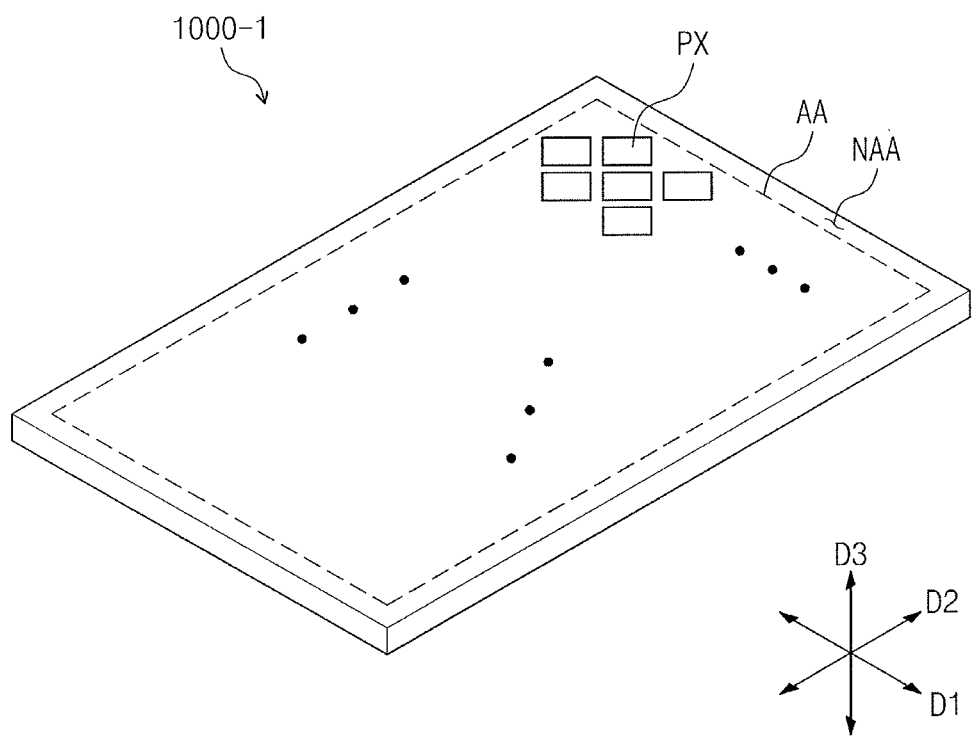
FIG. 8A illustrates a schematic perspective view of a display panel according to an embodiment.
Figure 8B:
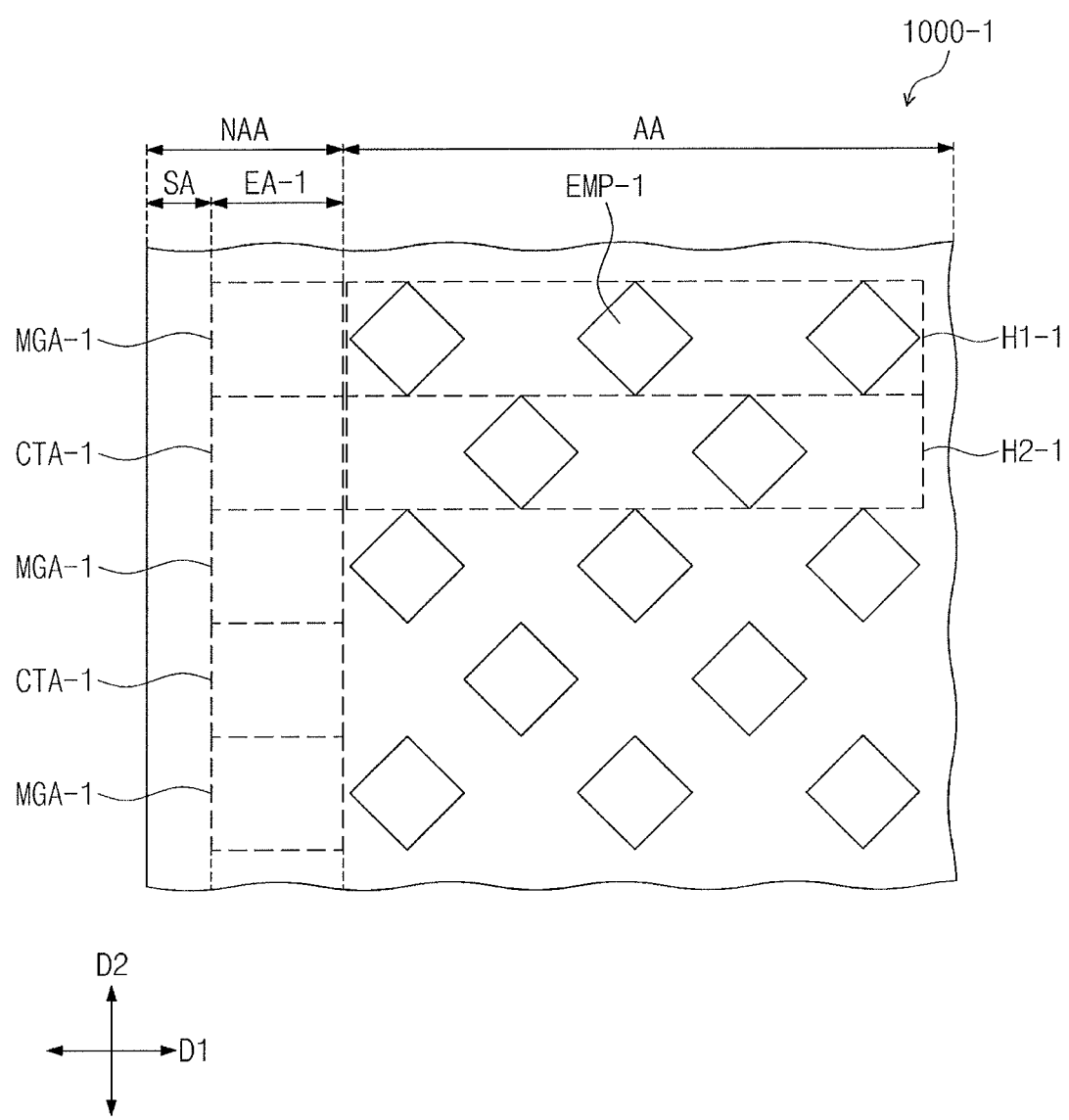
FIG. 8B illustrates an enlarged plan view of a portion of the display panel of FIG. 8A.

FIG. 8A illustrates a schematic perspective view of a display panel according to an embodiment. FIG. 8B illustrates an enlarged plan view of a portion of the display panel of FIG. 8A. Hereinafter, a display panel 1000-1 according to an embodiment will be described with reference to FIGS. 8A and 8B. In the present embodiment, the same components as described with reference to FIGS. 1 to 7 will be indicated by the same reference characters, and the descriptions thereto may be omitted.

As illustrated in FIG. 8A, the display panel 1000-1 may include a plurality of pixels PX-1, each of which may have a diamond shape on a plane defined by the first direction D1 and the second direction D2. The diamond shape of each of the pixels PX-1 may have a diagonal line extending in the first direction D1 and a diagonal line extending in the second direction D2.

As illustrated in FIG. 8B, the diamond shapes of the pixels PX-1 may be defined by shapes of emitting patterns EMP-1 respectively included in the pixels PX-1. The emitting patterns EMP-1 may be spaced apart from each other. The emitting patterns EMP-1 may generate the same color of light or different colors of lights.

The emitting patterns EMP-1 may be arranged in such a way that the emitting patterns EMP-1 of one of adjacent pixel rows do not overlap with the emitting patterns EMP-1 of the other of the next adjacent pixel rows in the second direction D2. For example, the emitting patterns EMP-1 disposed in a first pixel row H1-1 may not overlap or be aligned with the emitting patterns EMP-1 disposed in a second pixel row H2-1. In an implementation, the arrangement of the emitting patterns EMP-1 may be variously modified.

An edge area EA-1 may include a plurality of contact areas CTA-1 and a plurality of margin areas MGA-1 which are alternately arranged in the second direction D2. The contact areas CTA-1 and the margin areas MGA-1 may be respectively adjacent to the emitting patterns EMP-1 adjacent to the edge area EA-1 in the first direction D1.

In the present embodiment, the contact areas CTA-1 and the margin areas MGA-1 may have the same area. Each of the contact and margin areas CTA-1 and MGA-1 may be disposed to correspond to one pixel row. Each of the emitting patterns EMP-1 adjacent to the edge area EA-1 may face and overlap with one of the contact area CTA-1 and the margin area MGA-1 in the first direction D1.

Likewise, each of the first electrodes AE may face and overlap with one of the contact area CTA-1 and the margin area MGA-1 in the first direction D1. According to an embodiment, the arrangements of the contact areas CTA-1, the margin areas MGA-1 and the emitting patterns EMP-1 may be variously modified under the condition that one pixel row overlaps with one contact area or one margin area in the first direction D1.

Figure 9:
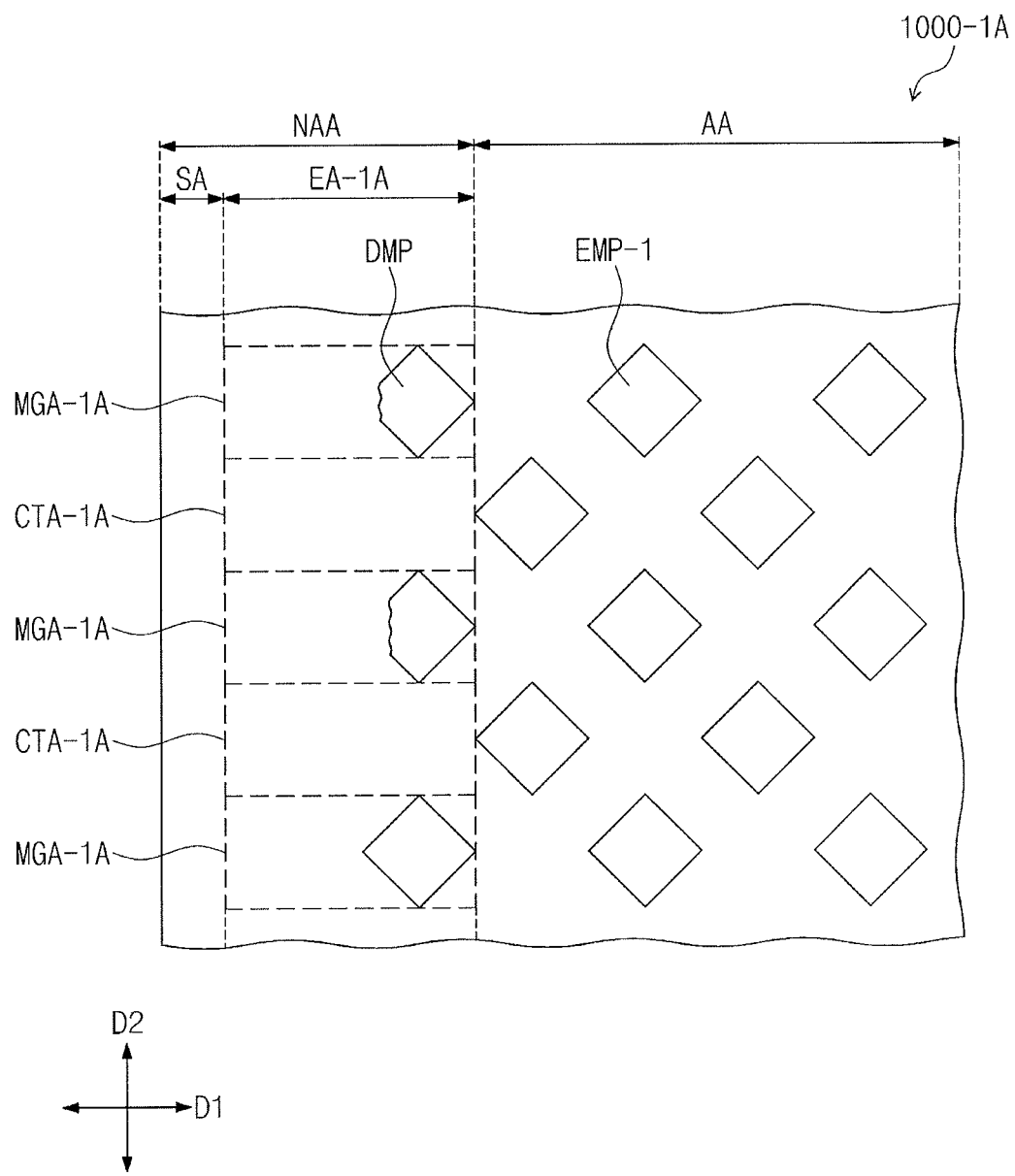
FIGS. 9 and 10 illustrate enlarged plan views of display panels according to an embodiment.
Figure 10:
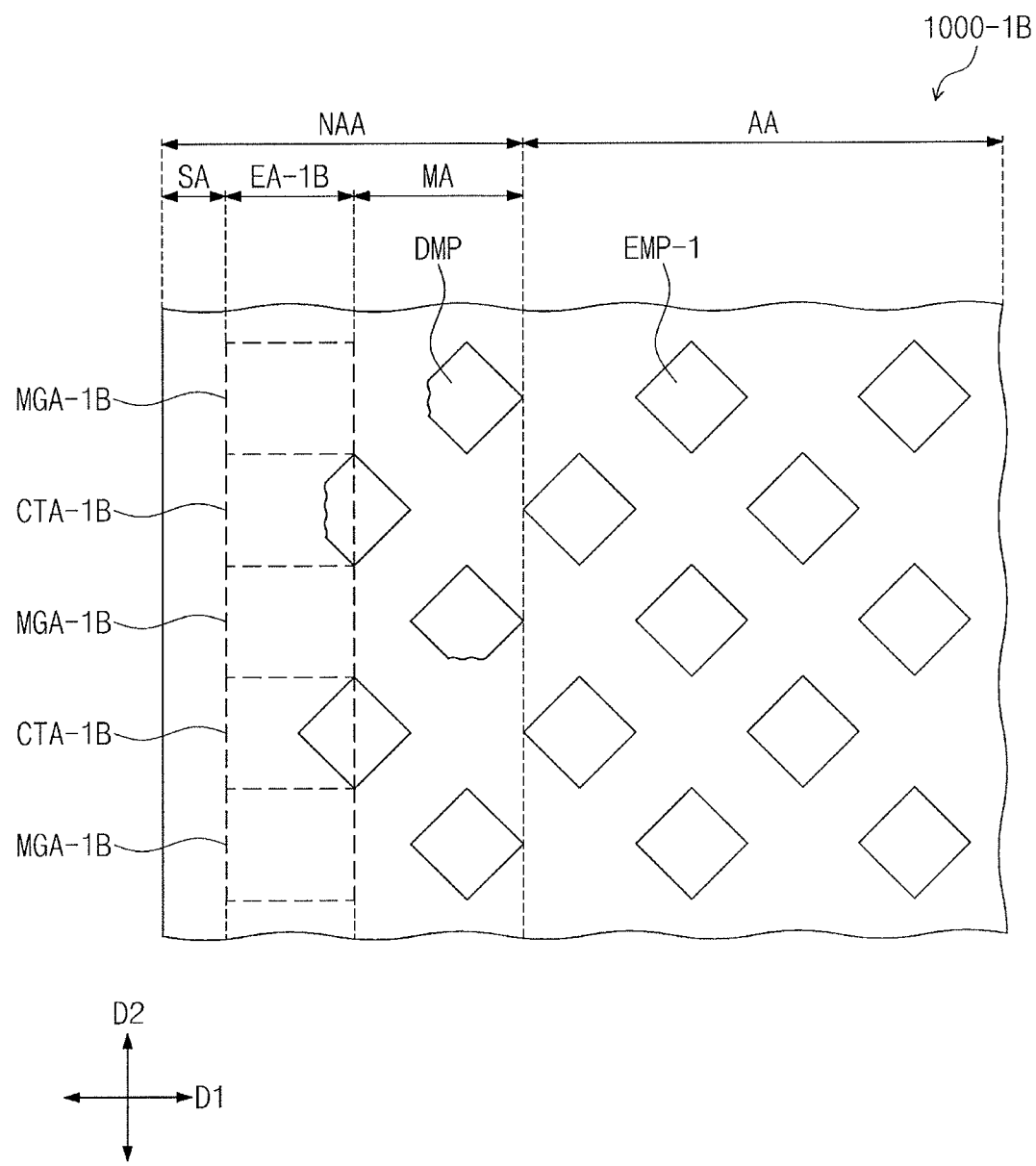

FIGS. 9 and 10 illustrate enlarged plan views of display panels according to an embodiment. FIG. 9 illustrates an area, corresponding to the area of FIG. 8B, of a display panel 1000-1A according to an embodiment. FIG. 10 illustrates an area, corresponding to the area of FIG. 8B, of a display panel 1000-1B according to an embodiment. Hereinafter, the display panels 1000-1A and 1000-1B according to an embodiment will be described with reference to FIGS. 9 and 10. In addition, the same elements as described with reference to FIGS. 1 to 8B will indicated by the same reference characters, and the descriptions thereto may be omitted or mentioned briefly.

As illustrated in FIG. 9, the display panel 1000-1A may further include dummy patterns DMP in an edge area EA-1A, as compared with the display panel 1000-1 illustrated in FIG. 8B. The dummy patterns DMP may be arranged continuously or aligned with the emitting patterns EMP-1. For example, the dummy patterns DMP may correspond to or be aligned with some of the emitting patterns EMP-1, and may be formed in the edge area EA-1A.

At least one of the dummy patterns DMP may have a shape or area different from those of the emitting patterns EMP-1. For example, some of the emitting patterns EMP-1 may not be deposited or may be excessively deposited, and thus the dummy patterns DMP may be formed. The emitting patterns EMP-1 may have substantially uniform shapes, as compared with the dummy patterns DMP. In an implementation, the display panel 1000-1A may further include the dummy patterns DMP, and relatively non-uniform patterns may be disposed in the edge area EA-1A. As a result, uniformity of the emitting patterns EMP-1 disposed in the active area AA may be improved, and reliability of the display panel 1000-1A may be improved.

In an implementation, the dummy patterns DMP may be inspection patterns for checking the shapes and/or an alignment degree of the emitting patterns EMP-1. In the display panel 1000-1A according to the present embodiment, the alignment degree and/or a deposition degree of the emitting patterns EMP-1 in the active area AA may be easily checked by inspecting the dummy patterns DMP in the peripheral area NAA.

As illustrated in FIG. 10, the display panel 1000-1B may further include an intermediate area MA which is defined in the peripheral area NAA and is between an edge area EA-1B and the active area AA. The dummy patterns DMP in the peripheral area NAA may be arranged in a plurality of columns along the second direction D2. According to the present embodiment, the edge area EA-1B may overlap with half of the dummy patterns DMP. Each of the emitting patterns EMP-1 may overlap with one of the margin areas MGA-1B or contact areas CTA-1B in the first direction D1.

An area of the peripheral area NAA of FIG. 10 may be greater than that of the peripheral area NAA of FIG. 9. According to the present embodiment, the intermediate area MA may be further provided according to a deposition aspect of the dummy patterns DMP, and the uniformity of the emitting patterns EMP disposed in the active area AA may be improved.

Figure 11A:
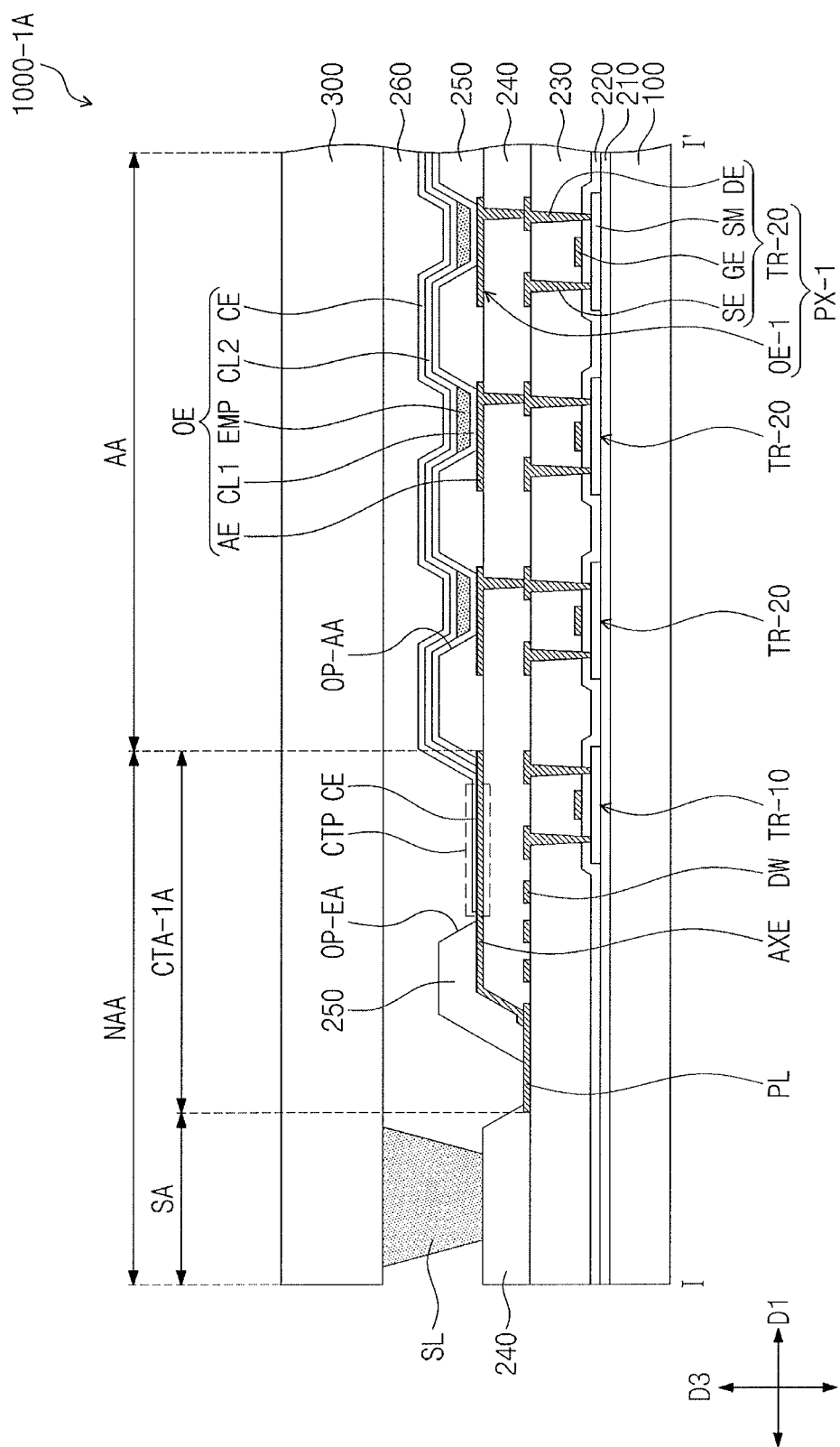
FIGS. 11A and 11B illustrate cross-sectional views of portions of a display panel according to an embodiment.
Figure 11B:
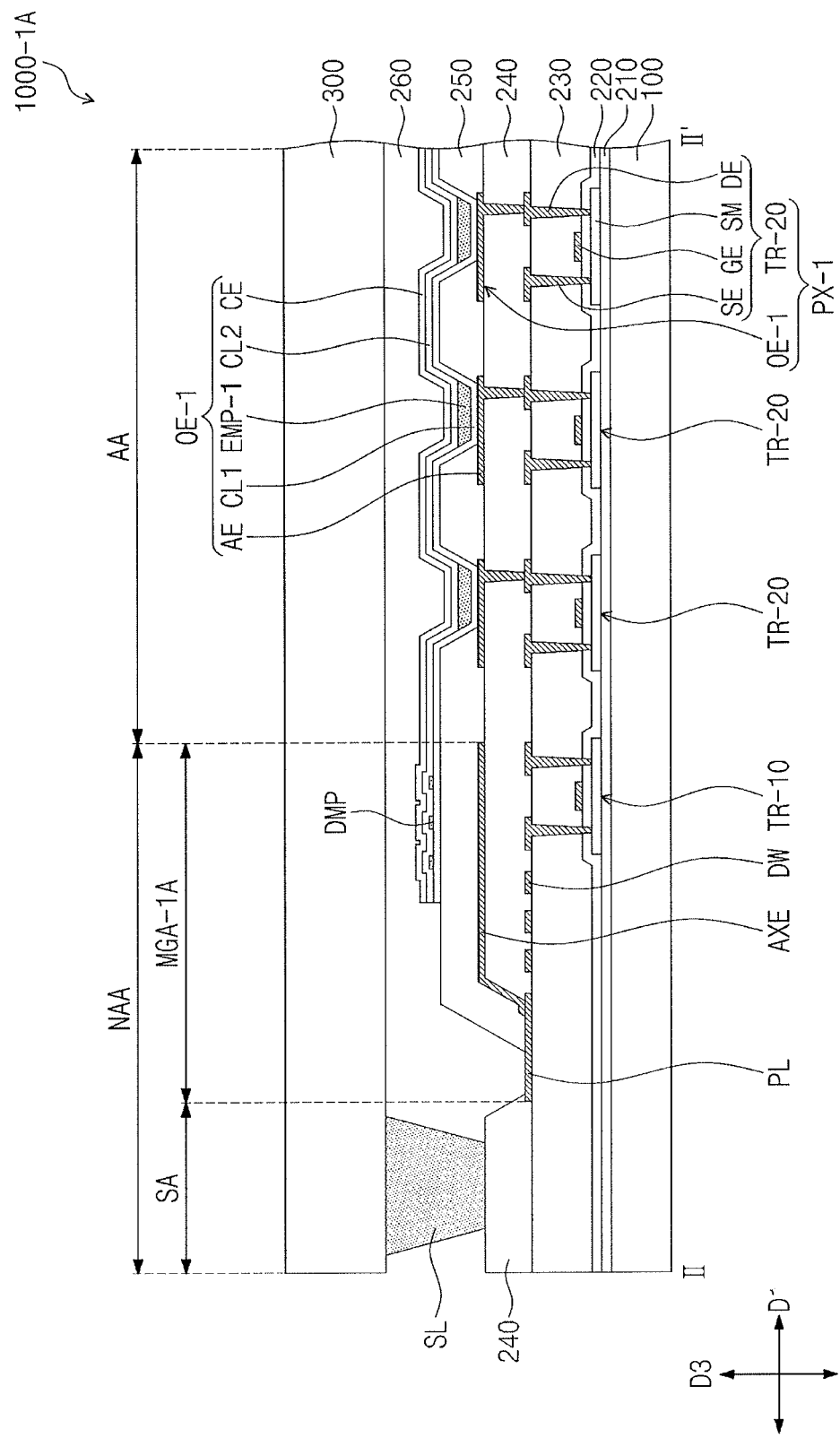

FIGS. 11A and 11B illustrate cross-sectional views of portions of a display panel according to an embodiment. Cross-sectional views of the display panel 1000-1A of FIG. 9 are illustrated as an example in FIGS. 11A and 11B. FIG. 11A illustrates an area including one contact area CTA-1A, which corresponds to FIG. 4A. FIG. 11B illustrates an area including one margin area MGA-1A, which corresponds to FIG. 4B. Hereinafter, the embodiment will be described with reference to FIGS. 11A and 11B. In the present embodiment, the same components as described with reference to FIGS. 1 to 10 will be indicated by the same reference characters, and the descriptions thereto may be omitted.

As illustrated in FIG. 11A, the contact portion CTP of the auxiliary electrode AXE and the second electrode CE may be in the contact area CTA-1A. The pixel defining layer 250 may expose at least a portion of the auxiliary electrode AXE through the edge opening OP-EA in the peripheral area NAA. The second electrode CE may extend from the active area AA into the edge area EA-1A and may be in direct contact with the exposed portion of the auxiliary electrode AXE.

As illustrated in FIG. 11B, the auxiliary electrode AXE and the second electrode CE may be spaced apart from each other in the margin area MGA-1A when viewed in a cross-sectional view. The pixel defining layer 250 and the first and second charge control layers CL1 and CL2 may be between the second electrode CE and the auxiliary electrode AXE.

In an implementation, a predetermined dummy pattern DMP may be disposed in the edge area EA-1A. Three patterns are illustrated as an example of the dummy pattern DMP in FIG. 11B. The dummy pattern DMP may be on the same layer as the emitting pattern EMP-1 of an organic light emitting element OE-1 included in the pixel PX-1. Thus, the dummy pattern DMP may be on the pixel defining layer 250 and may be between the first charge control layer CL1 and the second charge control layer CL2. The dummy pattern DMP may be in the peripheral area NAA to overlap with the auxiliary electrode AXE in a plan view.

According to the present embodiment, the margin area MGA-1A in which the dummy pattern DMP is disposed, and the contact area CTA-1A in which the contact portion CTP of the second electrode CE and the auxiliary electrode AXE is disposed may be alternately arranged in one direction (e.g., the second direction D2), and thus a width of the peripheral area NAA in the first direction D1 may be reduced. The auxiliary electrode AXE may include a first portion overlapping with the dummy pattern DMP and a second portion not overlapping with the dummy pattern DMP. An area in which the first portion of the auxiliary electrode AXE is disposed may be defined as the margin area MGA-1A, and an area in which the second portion of the auxiliary electrode AXE is disposed may be defined as the contact area CTA-1A in which the second electrode CE is connected to the auxiliary electrode AXE. Thus, both the margin area for organic layers and the contact area for electrical connection may be provided in a single edge area EA-1A extending in the second direction D2 (see FIG. 2). As a result, the area of the peripheral area NAA may be reduced, and thus the display panel having a desirably narrow bezel may be provided.

By way of summation and review, in the front surface light emitting type, the amount of the light outputted to the outside may be maximized by reducing a thickness of the second electrode to improve display quality. For example, the second electrode may be formed of a transparent conductive material and may be formed to have a thin thickness. As the thickness of the second electrode decreases, an electrical resistance of the second electrode may increase. For example, electrical conductivity of the second electrode may be reduced and the display quality of an organic light emitting display device may be deteriorated.

In addition, the organic light emitting display panel may include a peripheral area including various driving elements for driving pixels. The peripheral area may have a sufficient size (area) to secure or accommodate sizes (areas) of the driving elements and/or margin areas for forming a uniform active area.

According to the embodiments, the display panel having uniform brightness in the entire active area may be provided. In addition, according to the embodiments, the area of the peripheral area defining the bezel area may be reduced, and thus the display panel having the narrow bezel may be provided and a relatively wide active area may be secured.

The embodiments may provide a display panel capable of realizing uniform brightness in an entire active area and having a reduced bezel area.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display panel, comprising:
    an active area including a plurality of organic light emitting elements therein; and
    an edge area adjacent to the active area and including a power line and an auxiliary electrode therein, the auxiliary electrode being connected to the power line, and the edge area including a plurality of margin areas and a plurality of contact areas,
    wherein each of the organic light emitting elements includes:
        a first electrode;
        a second electrode on the first electrode; and
        a plurality of organic layers between the first electrode and the second electrode, wherein the plurality of organic layers include an emitting pattern including a light emitting material,
    wherein the auxiliary electrode and the second electrode are spaced apart from each other in the margin areas and are connected to each other in the contact areas,
    wherein the contact areas and the margin areas face, and are spaced apart in a first direction, from the first electrodes that are adjacent to the edge area,
    wherein the contact areas and the margin areas are alternately arranged in a second direction that intersects the first direction,
    wherein the first electrodes of the organic light emitting elements are spaced apart from each other and are arranged in a matrix form including rows arranged along the first direction and columns arranged along the second direction, and the second electrodes of the organic light emitting elements are connected to each other to constitute a single body shape,
    wherein the contact areas and the margin areas correspond to the rows, respectively,
    wherein each of rows corresponding to the contact areas is different from each of rows corresponding to the margin areas, and
    wherein sides of the margin areas are aligned with sides of the contact areas along the second direction, and each of the contact areas is center-aligned, along the first direction, with the emitting pattern corresponding to one of the rows of the first electrodes.

2. The display panel as claimed in claim 1, wherein:
    the organic layers include:
        a first charge control layer between the emitting pattern and the first electrode; and
        a second charge control layer between the emitting pattern and the second electrode, and
    the first charge control layer and the second charge control layer extend into the edge area and between the auxiliary electrode and the second electrode.

3. The display panel as claimed in claim 2, wherein the second electrode is in direct contact with the auxiliary electrode in each of the contact areas.

4. The display panel as claimed in claim 2, further comprising a pixel defining layer between the second electrodes and the first electrodes and including a plurality of openings, each opening exposing at least a portion of each of the first electrodes,
    wherein the emitting pattern is in respective ones of the openings.

5. The display panel as claimed in claim 4, wherein:
    the auxiliary electrode is covered by the pixel defining layer in each of the margin areas, and
    the auxiliary electrode is exposed by the pixel defining layer in each of the contact areas so as to be in contact with the second electrodes.

6. The display panel as claimed in claim 5, wherein:
    the pixel defining layer overlaps with the margin areas, and
    the first charge control layer, the second charge control layer, and the pixel defining layer are between the auxiliary electrode and the second electrode in each of the margin areas.

7. The display panel as claimed in claim 5, further comprising a plurality of dummy patterns on the pixel defining layer in the margin areas and including a light emitting material,
    wherein the dummy patterns and the contact areas are alternately arranged in the second direction.

8. The display panel as claimed in claim 1, wherein each of the margin areas is adjacent to the plurality of first electrodes, and each of the contact areas is adjacent to one of the first electrodes.

9. The display panel as claimed in claim 1, wherein the auxiliary electrode is on the same layer as the first electrode and is spaced apart from the first electrode when viewed in a plan view.

10. The display panel as claimed in claim 1, further comprising a seal area adjacent to the edge area and including a seal therein,
wherein the seal area surrounds the edge area.

11. A display panel, comprising:
a base substrate including:
an active area;
an edge area adjacent to the active area and including margin areas and contact areas alternately arranged in a second direction; and
a seal area adjacent to the edge area;
a plurality of first electrodes in the active area;
an auxiliary electrode in the edge area and spaced apart from the first electrodes in a plan view, the auxiliary electrode facing the first electrodes in a first direction that intersects the second direction;
a pixel defining layer on the base substrate and including a plurality of openings exposing the first electrodes, respectively;
a plurality of emitting patterns in the openings, respectively; and
a plurality of second electrodes overlapping with the plurality of emitting patterns and on the pixel defining layer,
wherein the second electrodes are spaced apart from the auxiliary electrode in the margin areas and are in contact with the auxiliary electrode in the contact areas,
wherein each of the contact areas and the margin areas overlaps with one of the first electrodes in the first direction,
wherein the first electrodes are spaced apart from each other and are arranged in a matrix form including rows arranged along the first direction and columns arranged along the second direction, and the second electrodes are connected to each other to constitute a single body shape,
wherein the contact areas and the margin areas correspond to the rows, respectively,
wherein each of rows corresponding to the contact areas is different from each of rows corresponding to the margin areas, and
wherein sides of the margin areas are aligned with sides of the contact areas along the second direction, and each of the contact areas is center-aligned, along the first direction, with the plurality of emitting patterns corresponding to one of the rows of the first electrodes.

12. The display panel as claimed in claim 11, wherein the contact areas do not overlap with the margin areas in the first direction.

13. The display panel as claimed in claim 12, further comprising:
a first charge control layer between the first electrodes and the emitting patterns; and
a second charge control layer between at least one of the second electrodes and the emitting patterns,
wherein the first charge control layer and the second charge control layer overlap with the margin areas.

14. The display panel as claimed in claim 11, wherein the auxiliary electrode is covered by the pixel defining layer in each of the margin areas and is exposed by the pixel defining layer in each of the contact areas so as to contact at least one of the second electrodes.

15. The display panel as claimed in claim 11, wherein each of the emitting patterns has a quadrilateral shape that has a side extending in the first direction and a side extending in the second direction in a plan view.

16. The display panel as claimed in claim 11, wherein each of the emitting patterns has a diamond shape that has a diagonal line extending in the first direction and a diagonal line extending in the second direction.

17. The display panel as claimed in claim 11, further comprising dummy patterns in the margin areas, the dummy patterns including a same material as the emitting patterns, wherein the dummy patterns and the contact areas are alternately arranged in the second direction.

* * * * *